United States Patent
Wada

(10) Patent No.: US 9,240,386 B2
(45) Date of Patent: Jan. 19, 2016

(54) SEMICONDUCTOR DEVICE AND PROCESS FOR PRODUCING SEMICONDUCTOR DEVICE

(71) Applicant: FUJITSU SEMICONDUCTOR LIMITED, Yokohama-shi, Kanagawa (JP)

(72) Inventor: Hajime Wada, Kuwana (JP)

(73) Assignee: FUJITSU SEMICONDUCTOR LIMITED, Kanagawa (JP)

( * ) Notice: Subject to any disclaimer, the term of this patent is extended or adjusted under 35 U.S.C. 154(b) by 0 days.

(21) Appl. No.: 14/609,004

(22) Filed: Jan. 29, 2015

(65) Prior Publication Data

US 2015/0140802 A1 May 21, 2015

Related U.S. Application Data

(62) Division of application No. 13/736,385, filed on Jan. 8, 2013, now Pat. No. 8,970,007.

(30) Foreign Application Priority Data

Jan. 17, 2012 (JP) .................................. 2012-006752

(51) Int. Cl.
 *H01L 21/00* (2006.01)
 *H01L 23/00* (2006.01)
 (Continued)

(52) U.S. Cl.
 CPC .......... *H01L 24/11* (2013.01); *H01L 21/76885* (2013.01); *H01L 23/544* (2013.01);
 (Continued)

(58) Field of Classification Search
 CPC .......................... H01L 21/3043; H01L 21/784

USPC .......................................................... 438/462
See application file for complete search history.

(56) References Cited

U.S. PATENT DOCUMENTS

| | | | |
|---|---|---|---|
| 7,119,439 B2 | 10/2006 | Watanabe et al. | |
| 7,417,304 B2 * | 8/2008 | Tsutsue ................. | H01L 23/562 257/620 |

(Continued)

FOREIGN PATENT DOCUMENTS

| | | |
|---|---|---|
| JP | 2004-79596 A | 3/2004 |
| JP | 2007-115988 A | 5/2007 |

(Continued)

OTHER PUBLICATIONS

Office Action dated Mar. 23, 2015, issued in corresponding Chinese Patent Application No. 201310017004.6, with English translation (10 pages).

(Continued)

*Primary Examiner* — Chandra Chaudhari
(74) *Attorney, Agent, or Firm* — Westerman, Hattori, Daniels & Adrian, LLP

(57) ABSTRACT

A semiconductor device includes: a substrate in which a product region and scribe regions are defined; a 1st insulation film formed above the substrate; a metal film in the 1st insulation film, disposed within the scribe regions in such a manner as to surround the product region; a 2nd insulation film formed on the 1st insulation film and the metal film; a 1st groove disposed more inside than the metal film in such a manner as to surround the product region, and reaching from a top surface of the 2nd insulation film to a position deeper than a top surface of the metal film; and a 2nd groove disposed more outside than the metal film in such a manner as to surround the metal film, and reaching from the top surface of the 2nd insulation film to a position deeper than the top surface of the metal film.

13 Claims, 23 Drawing Sheets

(51) Int. Cl.
*H01L 21/768* (2006.01)
*H01L 23/544* (2006.01)
*H01L 23/58* (2006.01)
*H01L 21/304* (2006.01)

(52) U.S. Cl.
CPC ............ *H01L23/562* (2013.01); *H01L 23/564* (2013.01); *H01L 23/585* (2013.01); *H01L 21/3043* (2013.01); *H01L 2224/13* (2013.01); *H01L 2924/13091* (2013.01)

(56) References Cited

U.S. PATENT DOCUMENTS

| | | | |
|---|---|---|---|
| 7,453,128 | B2 | 11/2008 | Tsutsue et al. |
| 8,912,076 | B2 * | 12/2014 | West ................. H01L 23/562 438/462 |
| 2004/0026785 | A1 | 2/2004 | Tomita |
| 2009/0014882 | A1 | 1/2009 | Ito et al. |
| 2009/0203192 | A1 | 8/2009 | Kaltalioglu et al. |
| 2010/0133669 | A1 | 6/2010 | Jao |
| 2010/0244199 | A1 | 9/2010 | Sakuma et al. |
| 2011/0233735 | A1 | 9/2011 | Yoshizawa et al. |

FOREIGN PATENT DOCUMENTS

| | | |
|---|---|---|
| JP | 2009-021528 A | 1/2009 |
| JP | 2010-238877 A | 10/2010 |
| JP | 2011-222939 A | 11/2011 |

OTHER PUBLICATIONS

Office Action dated Jul. 21, 2015, issued in counterpart Japanese application No. 2012-006752, with English Translation (10 pages).

Office Action dated Oct. 26, 2015, issued in counterpart Chinese Application No. 20130017004.6, with English ranslation (10 pages).

* cited by examiner

US 9,240,386 B2

SEMICONDUCTOR DEVICE AND PROCESS FOR PRODUCING SEMICONDUCTOR DEVICE

CROSS-REFERENCE TO RELATED APPLICATIONS

This application is a Divisional Application of U.S. application Ser. No. 13/736,385, filed Jan. 8, 2013, and is based upon and claims the benefit of priority of the prior Japanese Patent Application No. 2012-006752, filed on Jan. 17, 2012, the entire contents of which are incorporated herein by reference.

FIELD

The embodiments discussed herein are related to a semiconductor device and a process for producing semiconductor device.

BACKGROUND

A substrate (wafer) with semiconductor elements and a multiple-wiring-layer structure formed thereon is scribed and divided into respective product regions (chips). Around each of the product regions, scribe regions to be scribed are secured. Slightly inside the outer peripheral line of each product region, a moisture-resistant ring for preventing the intrusion of water into the product region from outside is formed. See JP 2010-238877 A and JP 2009-21528 A.

If the semiconductor wafer is cut in the scribe regions, cracks may occur from cut portions into the product regions as the case may be. If the cracks should reach product regions, the reliability of the products declines.

SUMMARY

According to one aspect of the present invention, a semiconductor device includes: a substrate in which a product region and scribe regions surrounding the product region are defined; a 1st insulation film formed above the substrate; a 1st metal film in the 1st insulation film, disposed within the scribe regions in such a manner as to surround the product region; a 2nd insulation film formed on the 1st insulation film and the 1st metal film; a 1st groove disposed more inside than the 1st metal film in such a manner as to surround the product region, and reaching from a top surface of the 2nd insulation film to a position deeper than a top surface of the 1st metal film; and a 2nd groove disposed more outside than the 1st metal film in such a manner as to surround the 1st metal film, and reaching from the top surface of the 2nd insulation film to a position deeper than the top surface of the 1st metal film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Example 1

Figure 1A:
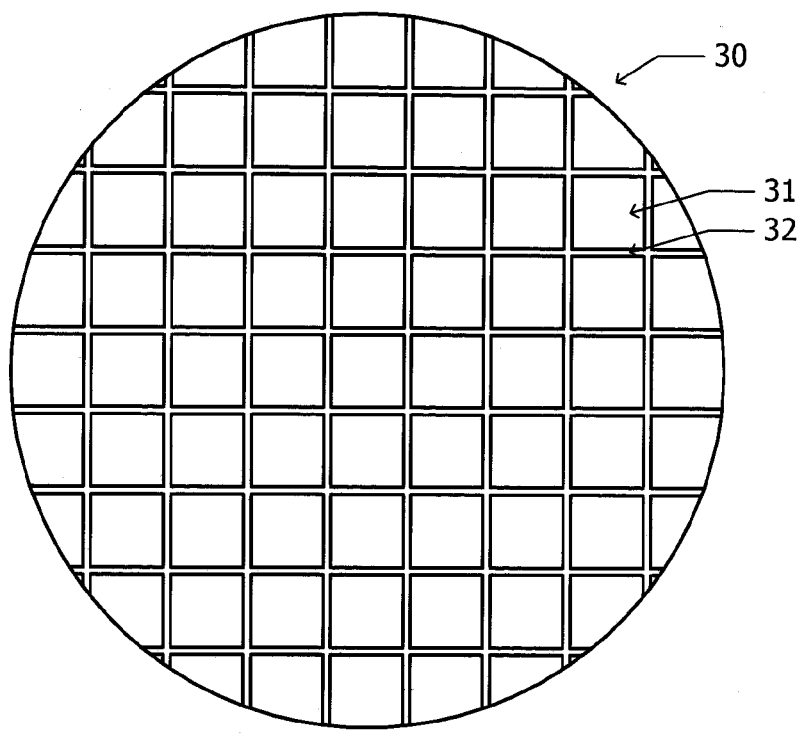
FIG. 1A is a plan view of a semiconductor wafer used for the semiconductor device of Example 1.

FIG. 1A is a plan view illustrating a semiconductor wafer (30) used for the semiconductor device of Example 1. As the semiconductor wafer (30), for example, a silicon wafer is used. On the surface of the semiconductor wafer (30), a plurality of product regions (chip regions) (31) disposed in a matrix are defined. Between the respective product regions (31), scribe regions (32) are secured. The planar form of the scribe regions is a square lattice.

Figure 1B:
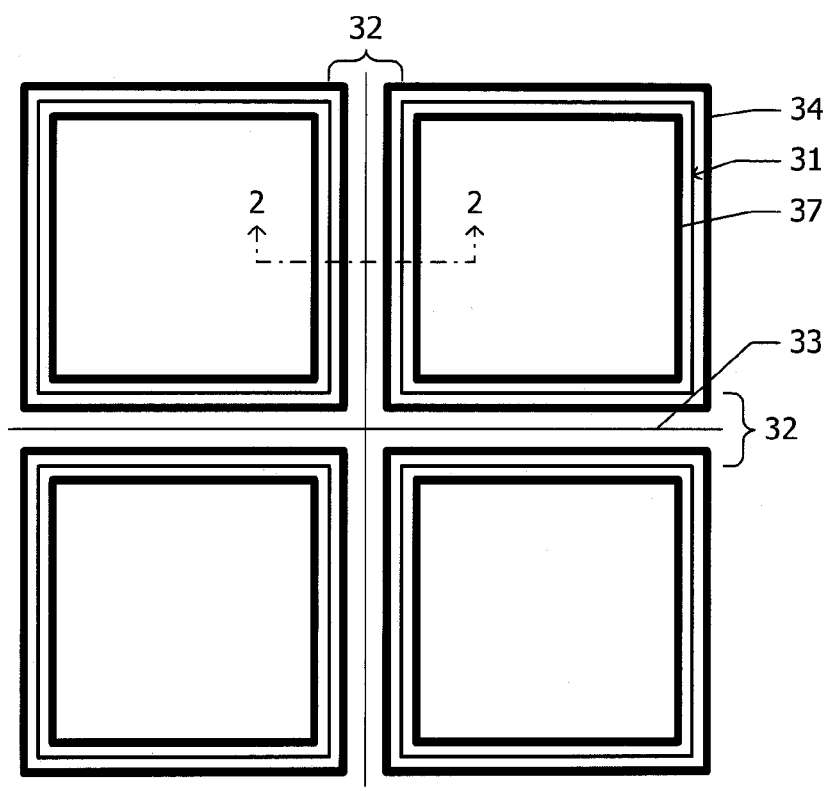
FIG. 1B is an expanded plan view illustrating product regions and scribe regions.

FIG. 1B is a plan view illustrating some product regions (31) and some scribe regions (32). In the product regions (31), moisture-resistant rings (37) are formed, and in the scribe regions (32), crack protection rings (34) are formed. Each crack protection ring (34) is disposed for each product region (31) and surrounds the corresponding product region (31). The planar form of each product region (31) is a rectangle or square, and the crack protection ring (34) includes the straight line portions extending in parallel to the respective sides of each product region (31). Each moisture-resistant ring (37) is disposed slightly inside the outer peripheral line of each product region (31). After completion of wafer process, the semiconductor wafer (30) (FIG. 1A) is scribed along the center scribe lines (33) positioned at the centers in the width directions of the respective scribe regions (32).

In reference to FIGS. 2 to 14, the process for producing the semiconductor device of Example 1 is explained. FIGS. 2 to 14 correspond to the sectional views at the position of the one-dot-dash line 2-2 of FIG. 1B.

Figure 2:
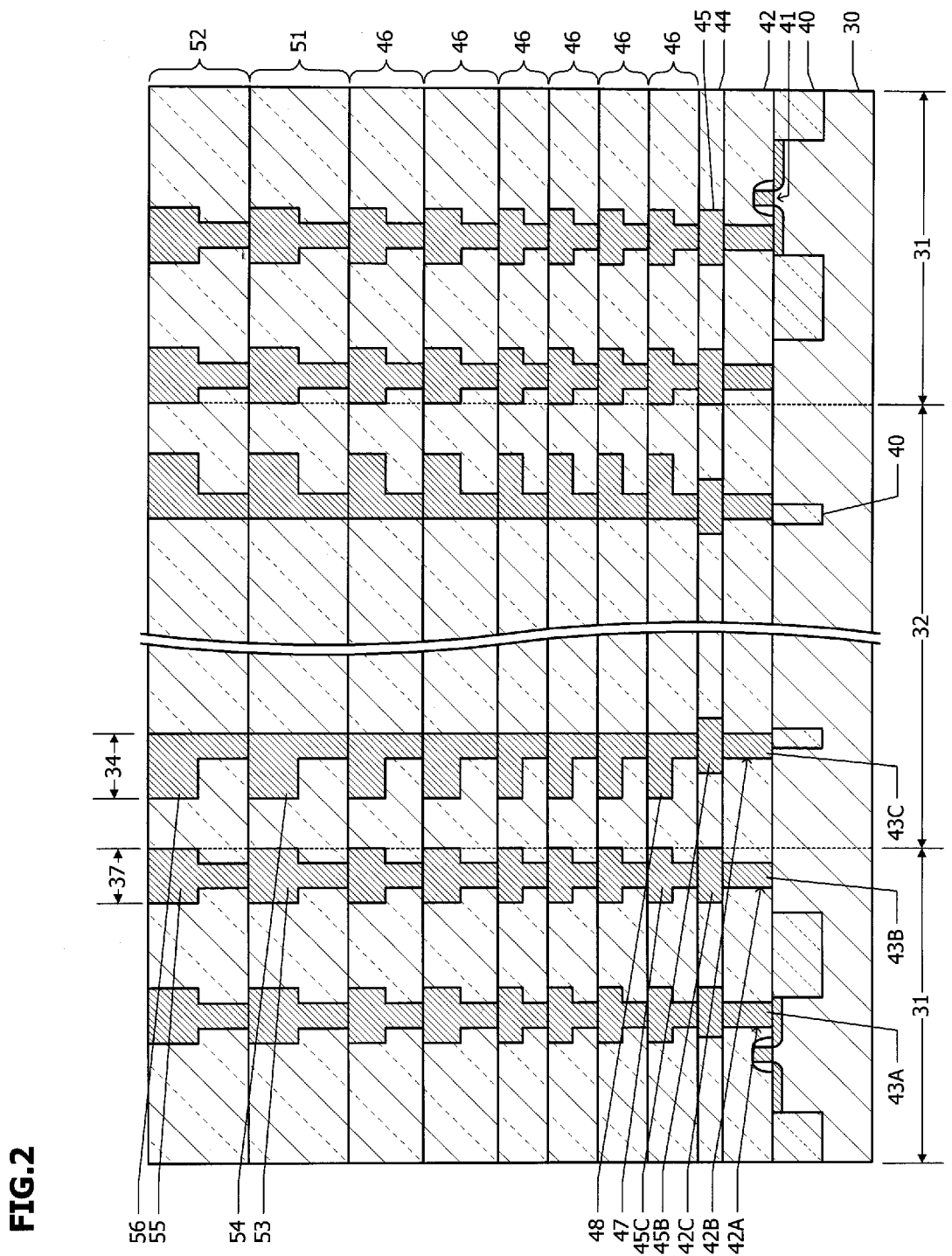
FIGS. 2 to 14 are sectional views illustrating the semiconductor device of Example 1 in a process of being produced.

In the central portion of FIG. 2, a scribe region (32) is disposed, and product regions (31) are disposed on both sides of the scribe region. In the surface layer portion of the product regions (31) and the scribe regions (32) of the semiconductor wafer (30), element separation insulating films (40) are formed. The element separation insulating films (40) are formed by the shallow trench isolation (STI) method or LOCOS (LOCal Oxidation of Silicon) method.

The element separation insulating films (40) in each scribe region (32) have a planar form to surround the corresponding product regions (31), and the width thereof is, for example, 1μm to 2 μm. The element separation insulating films (40) in the product regions (31) and the scribe regions (32) have a depth of, for example, 320 nm. In the active region surrounded by the element separation insulating films (40) in each product region (31), a MOS transistor (41) is formed.

On the semiconductor wafer (30), an insulation film (42) as a 1st via layer is formed to cover the MOS transistors (41). An example of the method for forming the insulation film (42) is explained below. At first, plasma-enhanced chemical vapor deposition (PE-CVD) is used to form an approx. 20 nm-thick silicon oxide film, and on the silicon oxide film, an 80 nm-thick silicon nitride film is formed. Further on the silicon nitride film, an approx. 1300 nm-thick borophosphosilicate glass (BPSG) film is formed, and annealing is performed at 650° C. for 120 seconds. An approx. 1000 nm-thick silicon oxide film may also be formed by CVD by using tetraethoxysilane (TEOS) and $O_2$ or $O_3$ as an alternative to the BPSG film. In this description, the silicon oxide film formed by CVD by using TEOS and $O_2$ or $O_3$ is called a TEOS film.

After forming the BPSG film, the surface is flattened by chemical mechanical polishing (CMP). On the flattened surface, an approx. 100 nm-thick silicon oxide film is formed by PE-CVD. The insulation film (42) has a laminate structure in which a silicon oxide film, a silicon nitride film, BPSG film and a silicon oxide film are laminated in this order. The thickness of the insulation film (42) is, for example, 450 nm.

Contact holes (42A) and grooves (42B) and (42C) are formed in the insulation film (42). Each contact hole (42A) partially exposes the source or drain of the corresponding MOS transistor (41). Each groove (42B) is formed in each product region (31), and has a planar form corresponding to that of the moisture-resistant ring (37) illustrated in FIG. 1B. Grooves (42C) partially overlap the corresponding element separation insulating films (40) in the corresponding scribe region (32), and have a planar form corresponding to that of the crack protection ring (34) illustrated in FIG. 1B. The edge of each groove (42C) on the inner peripheral side is positioned more on the product region (31) side than the edge of the corresponding element separation insulating film (40) on the inner peripheral side. The width of each groove (42C) disposed at the position of the corresponding crack protection ring (34) and the width of each groove (42B) disposed at the position of the moisture-resistant ring (37) are, for example, 0.1 µm.

Each contact hole (42A) formed in the insulation film (42) is filled with a contact plug (43A), and each groove (42B) is filled with a metal film (43B), while each groove (42C) is filled with a metal film (43C). The contact plugs (43A) and the metal films (43B) and (43C), each, contain a barrier metal film and a tungsten member. The barrier metal film has, for example, a two-layer structure including a 10 nm-thick Ti film and a 10 nm-thick TiN film.

On the insulation film (42), an insulation film (44) of a 1st wiring layer is formed. The insulation film (44) has, for example, a three-layer structure including a 30 nm-thick silicon carbide (SiC) film, a 130 nm-thick silicon oxide carbide (SiOC) film and a 100 nm-thick TEOS film. In the insulation film (44), copper wirings (45) are formed. In order to form the wirings (45), a single damascene process is applied. At the positions of each moisture-resistant ring (37) and each crack protection ring (34), metal films (45B) and (45C) are formed respectively. The widths of the metal films (45B) and (45C) are approx. 4 µm.

On the insulation film (44) and the wirings (45), 2nd to 7th wiring layers (46) are formed. In order to form these wiring layers (46), a dual damascene process is applied.

Each of the insulation films of the 2nd to 5th wiring layers (46) has, for example, a 3-layer structure including a 60 nm-thick SiC film, a 450 nm-thick SiOC film and a 100 nm-thick TEOS film. Each of the insulation films of the 6th and 7th wiring layers (46) has, for example, a 3-layer structure including a 70 nm-thick SiC film, a 920 nm-thick SiOC film and a 30 nm-thick TEOS film.

In each of the insulation films of the respective wiring layers (46), wirings and contact plugs formed of copper or copper alloy are disposed. In each of the 2nd to 5th wiring layers, the depth from the top surface of the insulation film to the bottom surface of the wiring is approx. 275 nm. In each of the 6th and 7th wiring layers, the depth from the top surface of the insulation film to the bottom surface of the wiring is approx. 500 nm.

In each of the 2nd to 7th wiring layers (46), in the regions corresponding to each moisture-resistant ring (37) and each crack protection ring (34), metal films (47) and (48) are respectively disposed. The metal films (47) and (48) are formed of copper or copper alloy, and are formed simultaneously with the wirings and contact plugs in the corresponding wiring layer (46). The respective metal films (47) and (48) have planar forms corresponding to those of the moisture-resistant rings (37) and the crack protection rings (34) illustrated in FIG. 1B.

In each of the 2nd to 5th wiring layers (46), the widths of the metal films (47) and (48) in the portions having the same depths as those of the contact plugs are approx. 0.09 µm. In each of the 6th and 7th wiring layers (46), the widths of the metal films (47) and (48) in the portions having the same depths as those of the contact plugs are approx. 0.28 µm. In each of the 2nd to 7th wiring layers (46), the widths of the metal films (47) and (48) in the portions having the same depths as those of the wirings are approx. 4 µm.

Each metal film (47) contacts the corresponding metal film (47) of the wiring layer (46) present immediately below it and contacts the corresponding metal film (47) of the wiring layer (46) present immediately above it. Each metal film (48) also contacts the corresponding metal film (48) of the wiring layer (46) present immediately below it and contacts the corresponding metal film (48) of the wiring layer (46) present immediately above it. The respective metal films (47) and (48) of the 2nd wiring layer (46) contact the respectively corresponding metal films (45B) and (45C) in the 1st wiring layer (44).

On the 7th wiring layer (46), an 8th wiring layer (51) and a 9th wiring layer (52) are formed. Also for forming the 8th and 9th wiring layers (51) and (52), a dual damascene process is applied. Each of the insulation films of the 8th and 9th wiring layers (51) and (52) has, for example, a 2-layer structure including a 70 nm-thick SiC film and a 1500 nm-thick $SiO_2$ film. In each of the 8th and 9th wiring layers (51) and (52), the depth from the top surface of the insulation film to the bottom surface of the wiring is approx. 800 nm.

In the regions corresponding to each moisture-resistant ring (37) and each crack protection ring (34) in the insulation film of the 8th wiring layer (51), metal films (53) and (54) are respectively disposed. In the regions corresponding to each moisture-resistant ring (37) and each crack protection ring (34) in the insulation film of the 9th wiring layer (52), metal films (55) and (56) are respectively disposed. Of the metal films (53) to (56), the widths of the metal films in the portions having the same depths as those of the contact plugs are approx. 0.42 µm, and the widths of the metal films in the portions having the same depths as those of the wirings are approx. 4 µm.

The metal films (53) and (54) in the 8th wiring layer (51) respectively contact the corresponding metal films (47) and (48) in the 7th wiring layer (46). The metal films (55) and (56) in the 9th wiring layer (52) respectively contact the corresponding metal films (53) and (54) in the 8th wiring layer (51).

Figure 3:
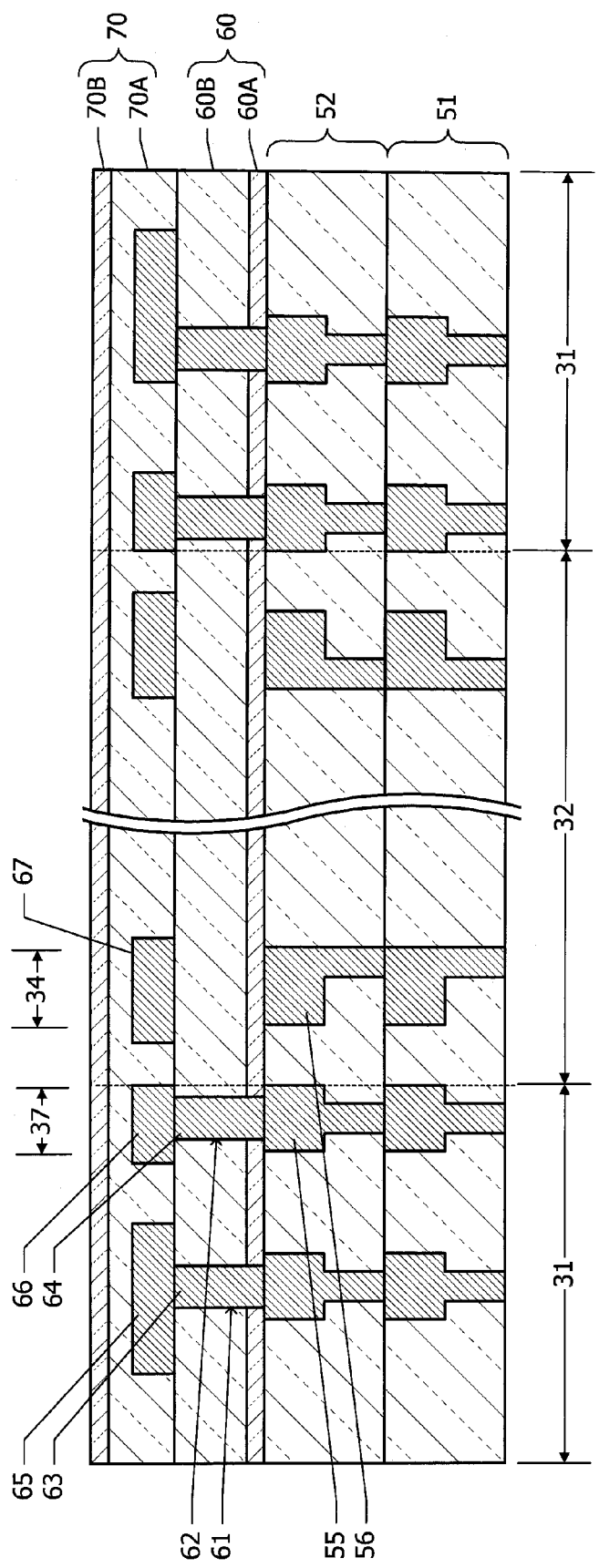

FIGS. 3 to 14 illustrate structures by omitting the structure of the 7th wiring layer (46) and below. As illustrated in FIG. 3, on the 9th wiring layer (52), an insulation film (60) is formed. The insulation film (60) is formed, for example, of two layers including a 70 nm-thick SiC film (60A) and a 1200 nm-thick SiO$_2$ film (60B). After the SiO$_2$ film (60B) is deposited, the surface portion is polished by approx. 300 to approx. 400 nm by means of CMP. The thickness of the flattened insulation film (60) is approx. 1 μm.

In the insulation film (60), via holes (61) and grooves (62) are formed. Each via hole (61) exposes the surface of the corresponding wiring of the lower layer. Each groove (62) exposes the surface of the corresponding metal film (55) of the lower layer forming a portion of the corresponding moisture-resistant ring (37). The width of each groove (62) is, for example, 0.4 μm. Each via hole (61) is filled with a contact plug (63), and each groove (62) is filled with a metal film (64). Each contact plug (63) and each metal film (64) contain a barrier metal film and a tungsten film.

On the insulation film (60), electrode pads (65) and metal films (66) and (67) are formed, for example, by using aluminum. Meanwhile, metal films different in etching properties from the metal films (55) and (56) of the 9th wiring layer (52) may also be used as an alternative to Al. The electrode pads (65) and the metal films (66) and (67), each, have a thickness of, for example, 1100 nm. Each electrode pad (65) is connected with the corresponding contact plug (63) of the lower layer. Each metal film (66) forms a portion of the corresponding moisture-resistant ring (37). Each metal film (67) is disposed above the corresponding metal film (56) forming the corresponding crack protection ring (34), and has a planar form surrounding the corresponding product region (31).

A protection film (70) is formed on the insulation film (60), the electrode pads (65) and the metal films (66) and (67). The protection film (70) is formed, for example, of two layers including a 1400 nm-thick SiO$_2$ film (70A) and a 500 nm-thick SiN film (70B).

Figure 4:
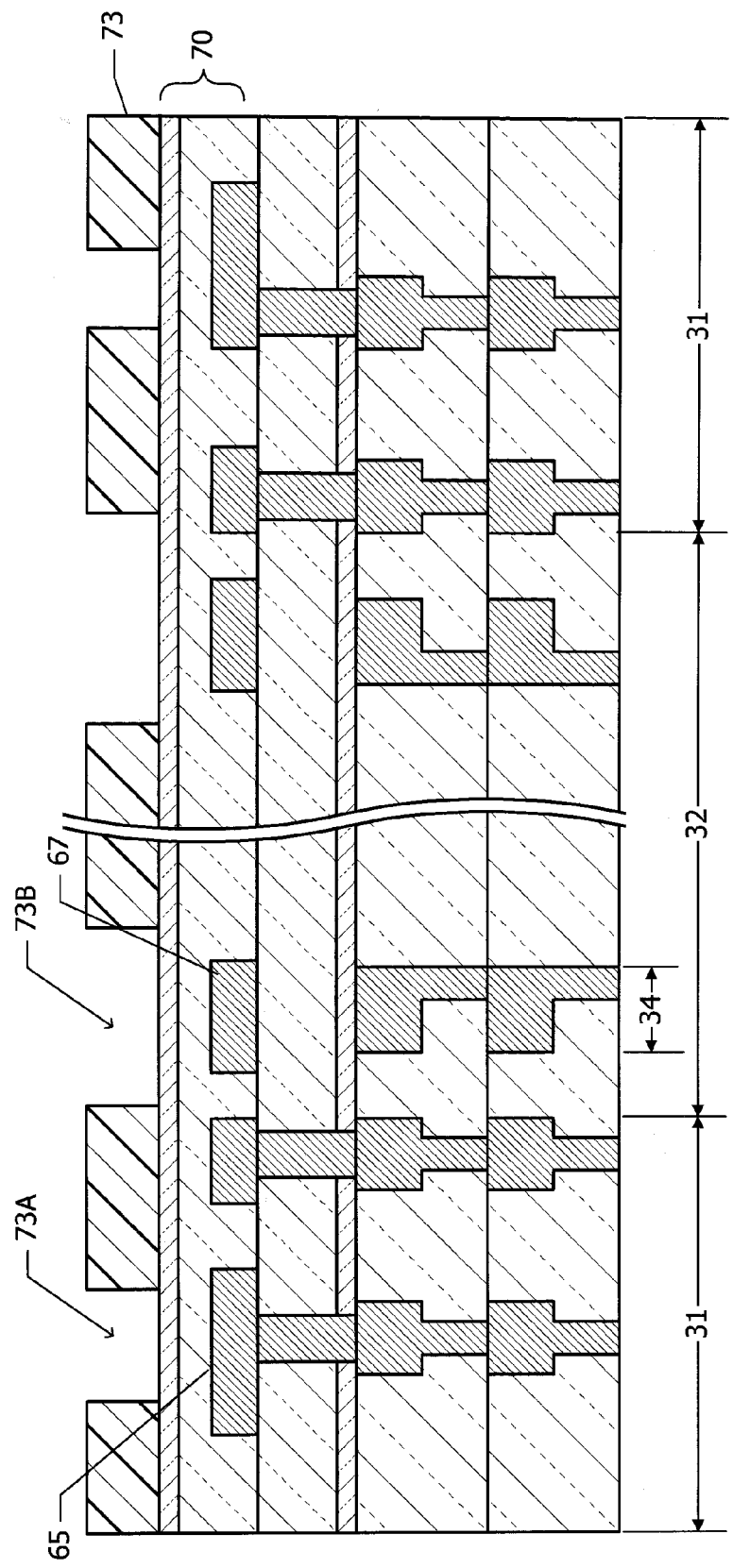

As illustrated in FIG. 4, a mask pattern (73) is formed on the protection film (70). The mask pattern (73) is formed, for example, of a photoresist. In the mask pattern (73), openings (73A) and (73B) are formed. Each opening (73A) is disposed above the corresponding electrode pad (65) and is included in the electrode pad (65) on a plan view. Each opening (73B) is disposed above the corresponding crack protection ring (34) and includes the metal film (67) on a plan view.

The edge of each opening (73B) on the inner peripheral side is positioned more on the product region (31) side than the edge of the corresponding metal film (67) on the inner peripheral side, and the edge of each opening (73B) on the outer peripheral side is positioned more outside than the edge of the corresponding metal film (67) on the outer peripheral side.

Figure 5:
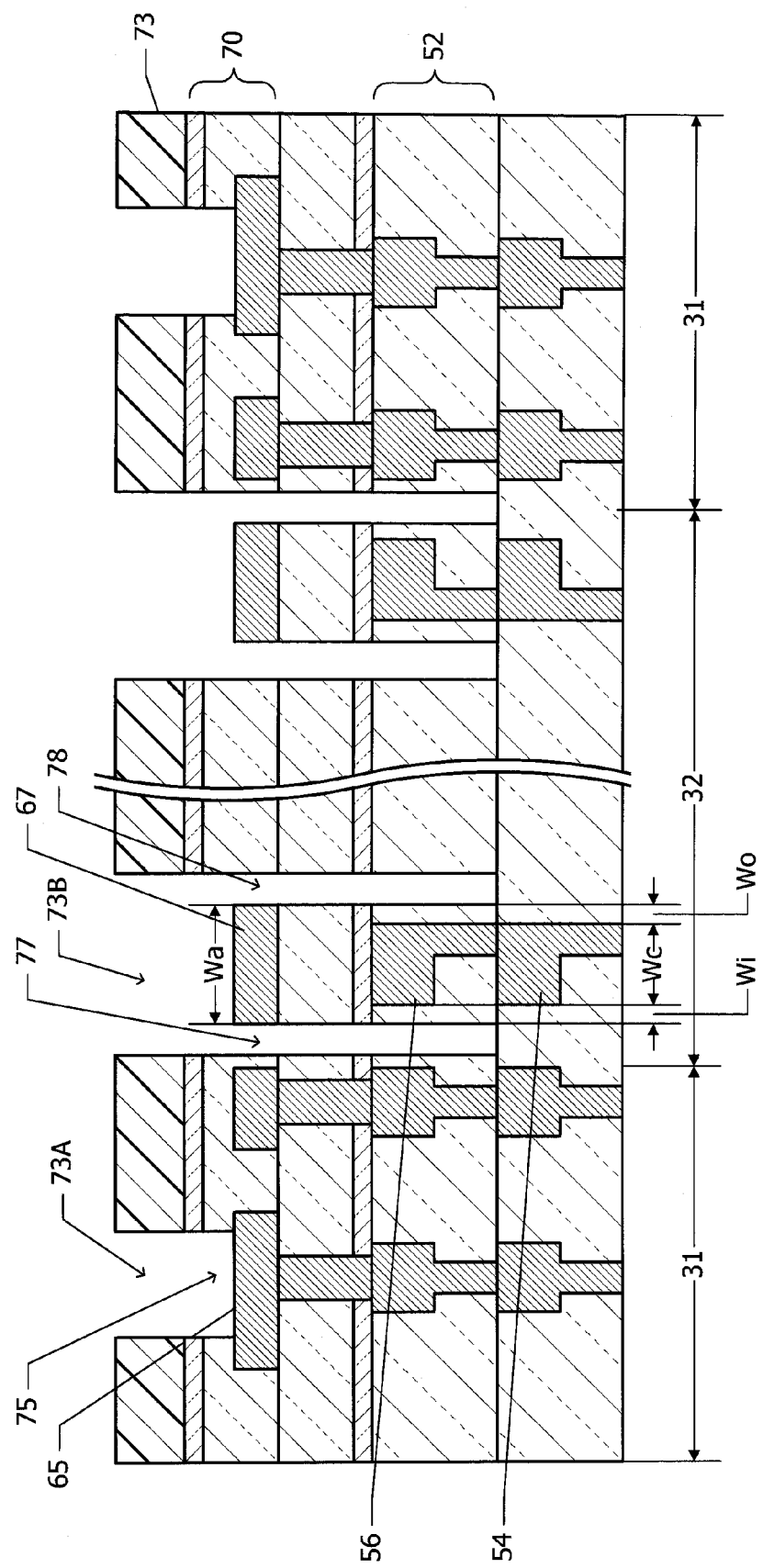

As illustrated in FIG. 5, the mask pattern (73) is used as an etching mask, to etch the protection film (70). The etching forms a pad opening portion (75) at the position of each opening (73A). At the bottom surface of the pad opening portion (75), the corresponding electrode pad (65) is exposed. In the region where each opening (73B) is formed, the corresponding metal film (67) is exposed. Even after exposing the electrode pads (65) and the metal films (67), etching is continued.

Each metal film (67) acts as an etching mask, to form a groove (77) on the inner peripheral side of the corresponding metal film (67), and to form a groove (78) on the outer peripheral side. Etching is performed till the depths of the grooves (77) and (78) become deeper than the top surface of the corresponding metal film (56) disposed in the insulation film (52). FIG. 5 illustrates a case where the grooves (77) and (78) reach the same depth as that of the bottom surface of the insulation film (52), i.e., reach the same depth as that of the bottom surface of the corresponding metal film (56). After the grooves (77) and (78) are formed, the mask pattern (73) is removed. Each metal film (67) acts as an etching mask, and consequently even after the grooves (77) and (78) are formed, each metal film (56) formed of Cu below the corresponding metal film (67) is not exposed. Because of this configuration, the production device used in these steps and in the subsequent steps (including the re-wiring step) can be prevented from being contaminated by Cu. With the steps performed so far, the wafer process is completed. Subsequently, the re-wiring step of wafer level chip size package (WLCSP) is performed.

Figure 6:
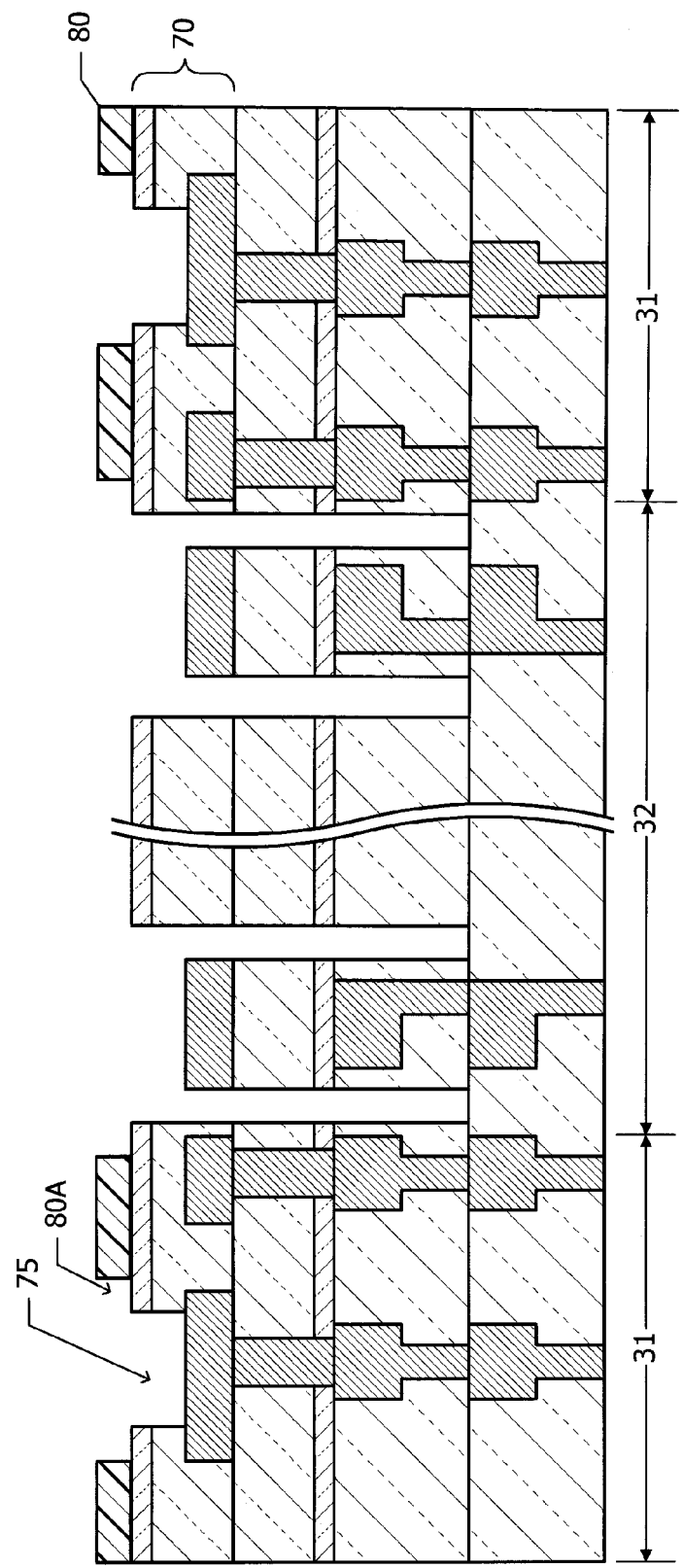

As illustrated in FIG. 6, on the protection film (70), a lower resin film (80) is formed. For the lower resin film (80), for example, a polyimide is used. In the lower resin film (80), openings (80A) each containing a pad opening portion (75) are formed on a plan view. In the scribe regions (32), the lower resin film (80) is not formed.

Figure 7:
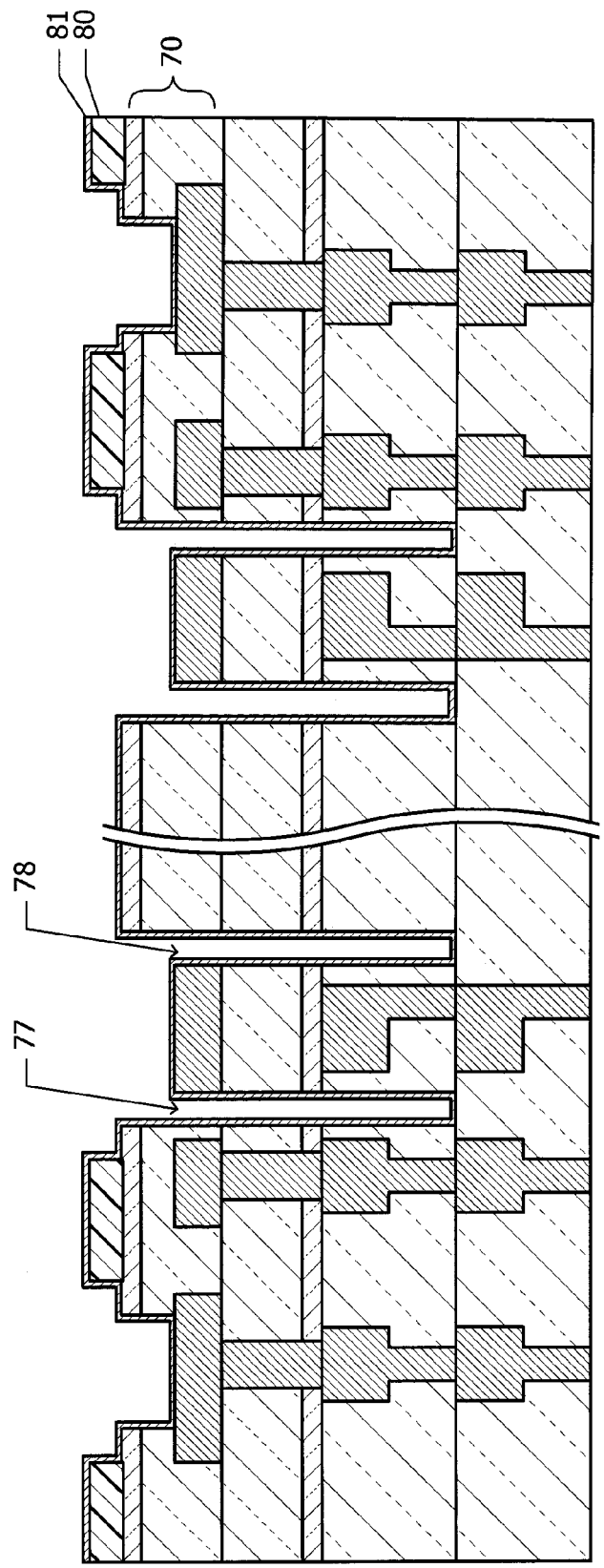

As illustrated in FIG. 7, on the entire exposed surface, a seed film (81) is formed. The seed film (81) is formed, for example, of two layers including a Ti film and a Cu film. In order to form the seed film (81), for example, sputtering is applied. The bottom surfaces and the lateral surfaces of the grooves (77) and (78) are also covered with the seed film (81).

Figure 8:
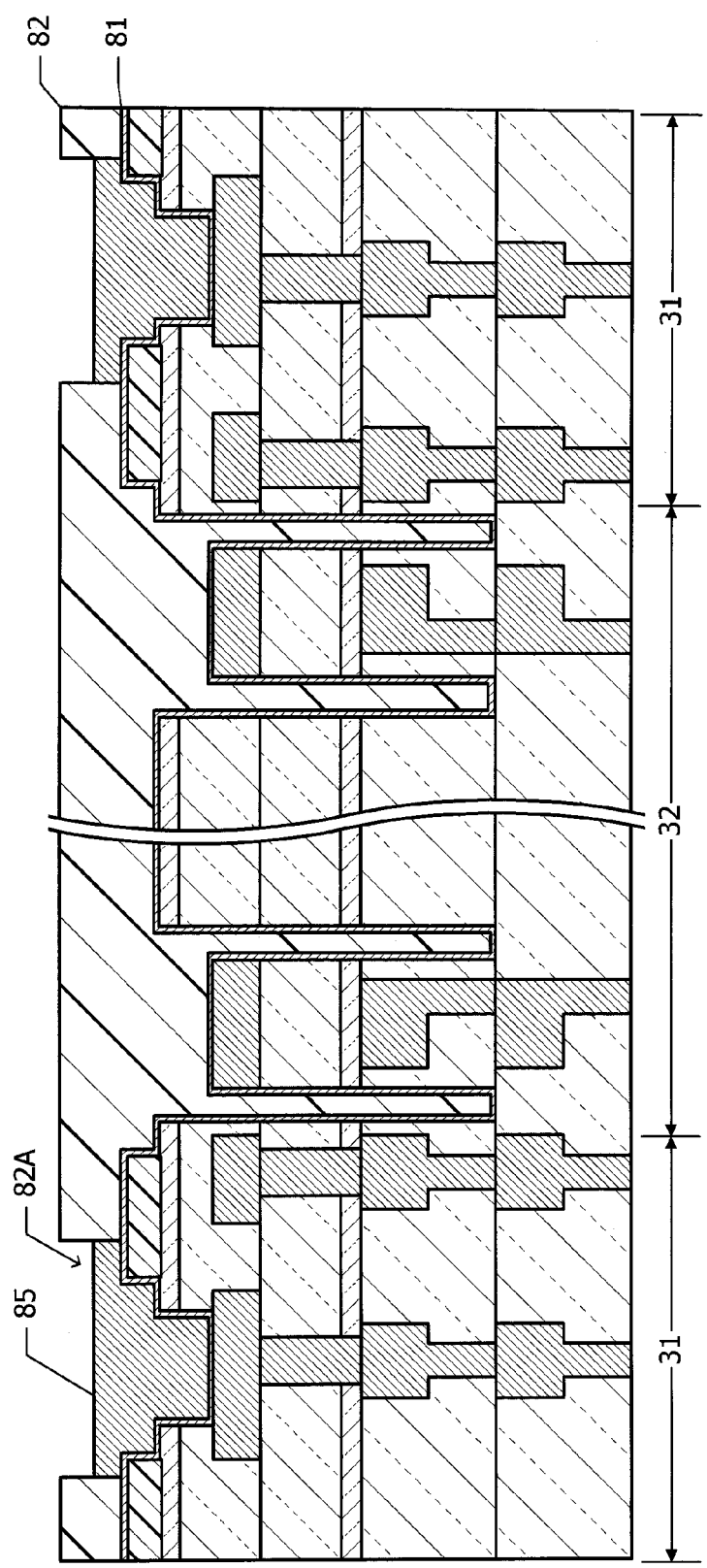

As illustrated in FIG. 8, a resist film (82) is formed on the seed film (81). In the resin film (82), openings (82A) corresponding to the wiring pattern to be formed are formed. The scribe regions (32) are covered with the resist film (82). With the seed film (81) as an electrode, the seed film (81) at the bottom surface of each opening (82A) is plated with copper. With this operation, copper wirings (85) are formed. After the wirings (85) are formed, the resist film (82) is removed. The seed film (81) that had been covered with the resist film (82) is exposed.

Figure 9:
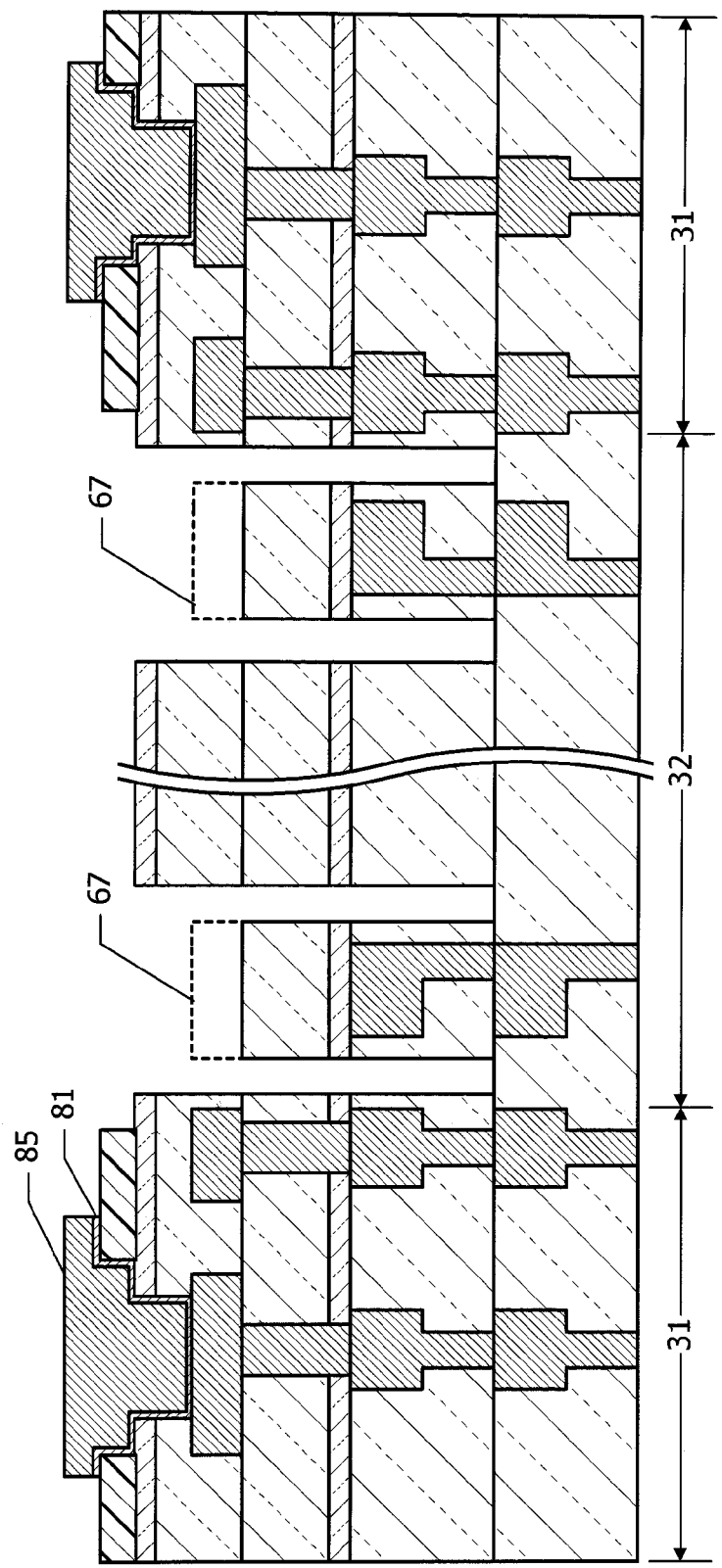

As illustrated in FIG. 9, the exposed seed film (81) (see FIG. 8) is removed by dry etching. Subsequently, an alkali chemical solution treatment is applied to perform a surface treatment. With this operation, the insulation among the plurality of wirings (85) can be secured. At the same time, with the chemical solution treatment, the metal films (67) disposed in the scribe regions (32) are also removed. Under the wirings (85), the seed film (81) remains.

Figure 10:
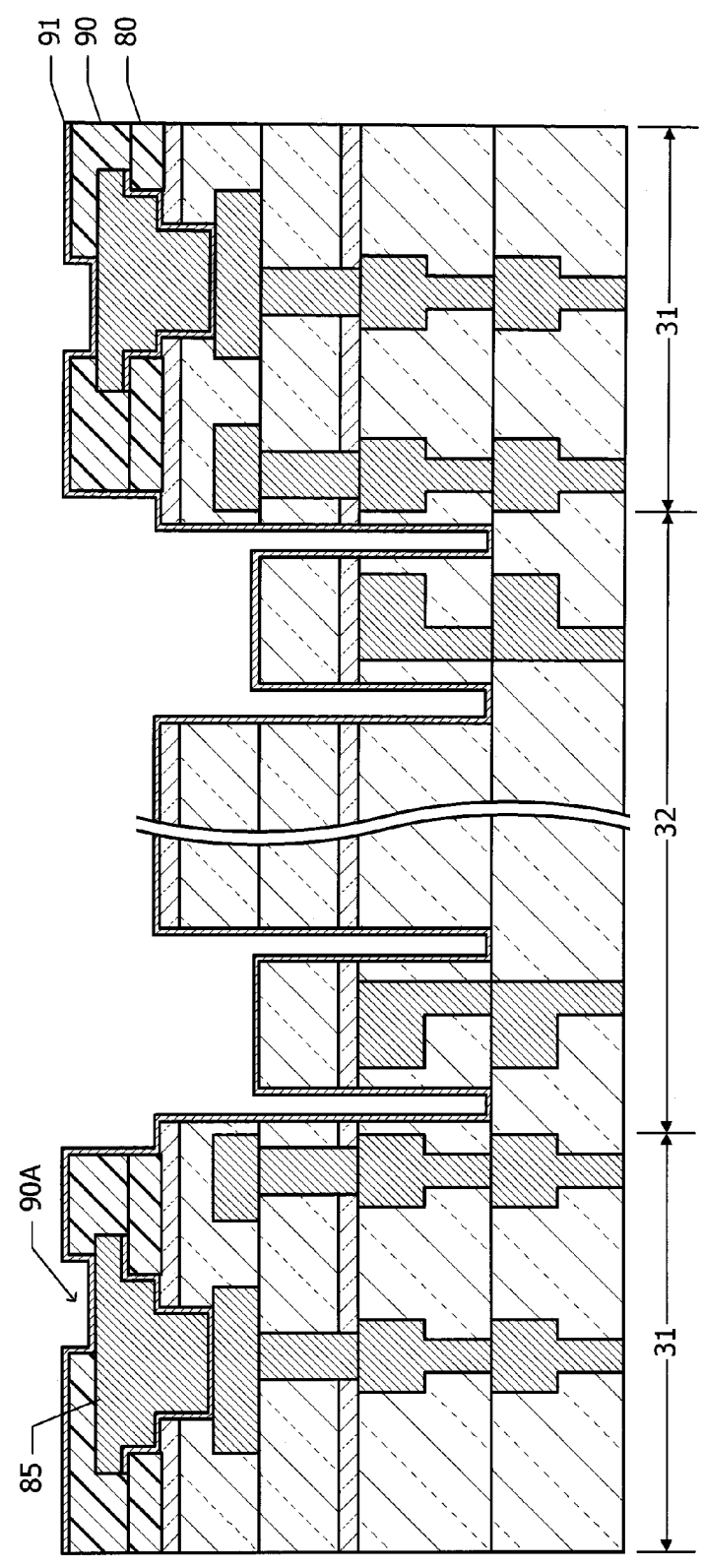

As illustrated in FIG. 10, an upper resin layer (90) is formed on the lower resin film (80) and the wirings (85). For the upper resin film (90), for example, a polyimide is used. In the upper resin film (90), openings (90A) are formed. Each opening (90A) is disposed within the corresponding wiring (85) on a plan view, to partially expose the surface of the wiring (85). When the openings (90A) are formed, the upper resin film (90) on the scribe regions (32) is also removed.

On the entire exposed surface, a seed film (91) is formed. The seed film (91) is formed, for example, of 2 layers including a Ti film and a Cu film. For forming the Ti film and the Cu film, for example, sputtering is applied.

Figure 11:
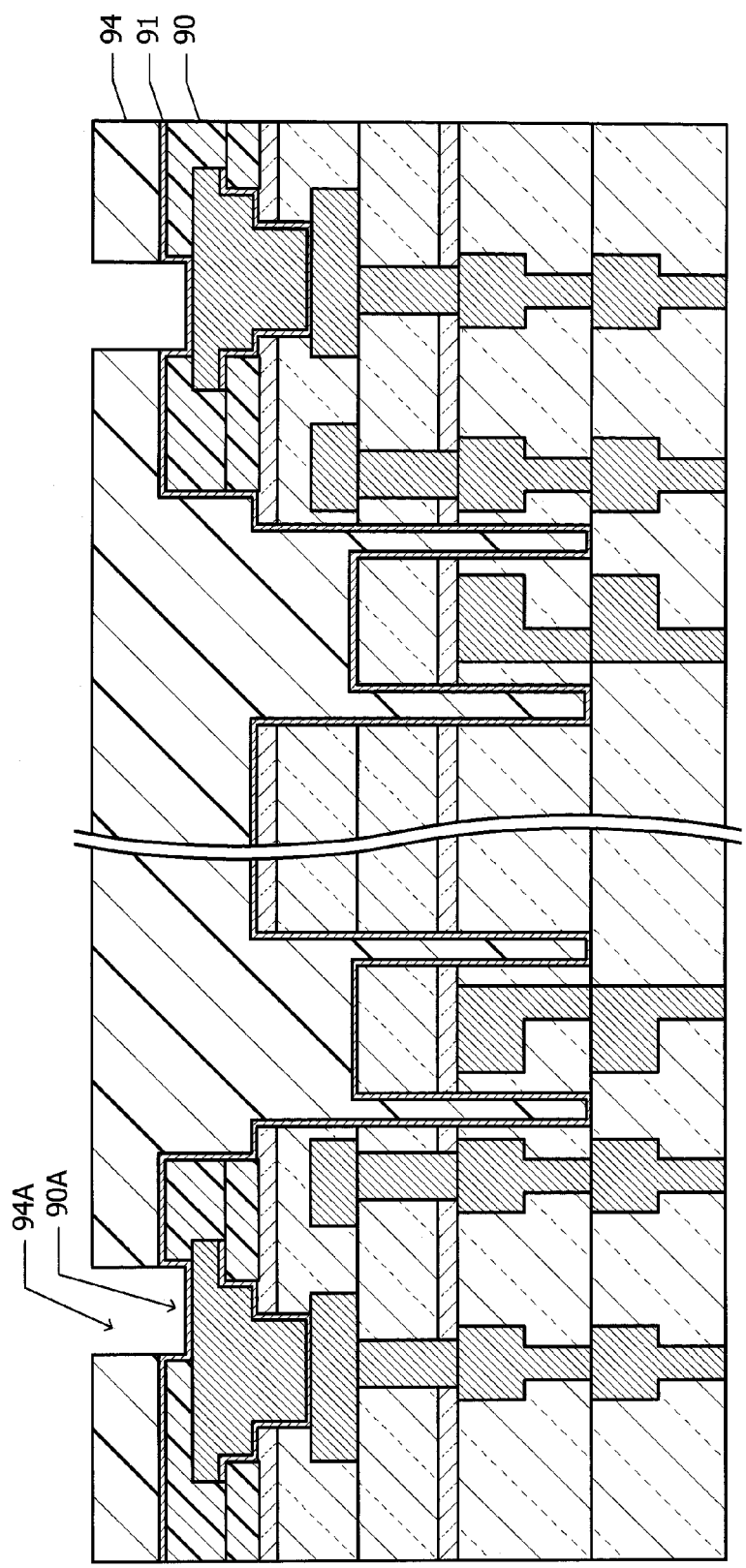

As illustrated in FIG. 11, on the seed film (91), a resist film (94) is formed. In the resist film (94), openings (94A) are formed. Each opening (94A) has a planar form almost overlying the corresponding opening (90A) formed in the upper resin film (90).

Figure 12:
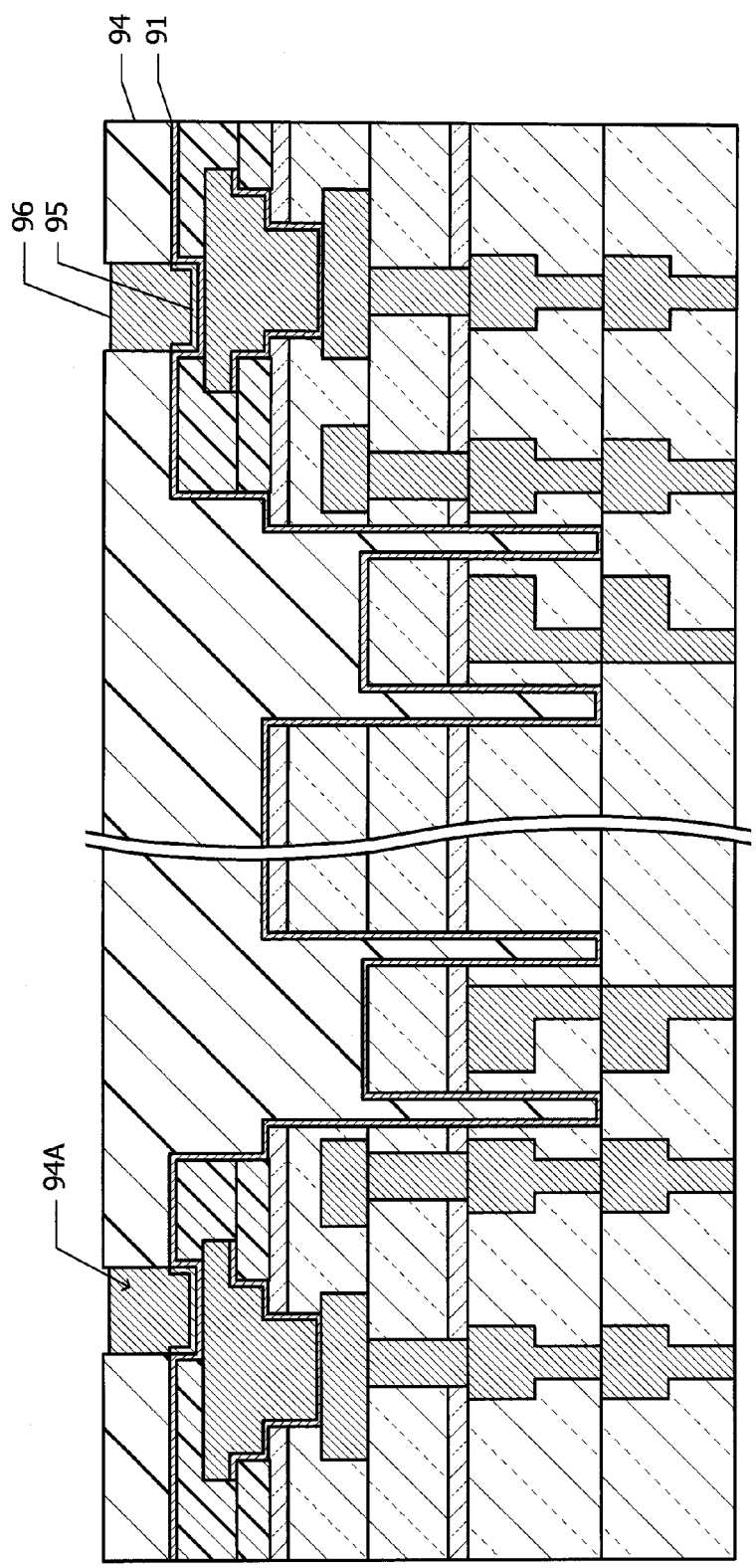

As illustrated in FIG. 12, with the seed film (91) as an electrode, the seed film (91) in each opening (94A) is plated with nickel (Ni). Further, the Ni plating layer is plated with SnAg. With this operation, a bump backing film (95) made of Ni and a bump (96) made of SnAg are formed in each opening (94A). After the bumps (96) are formed, the resist film (94) is removed.

Figure 13:
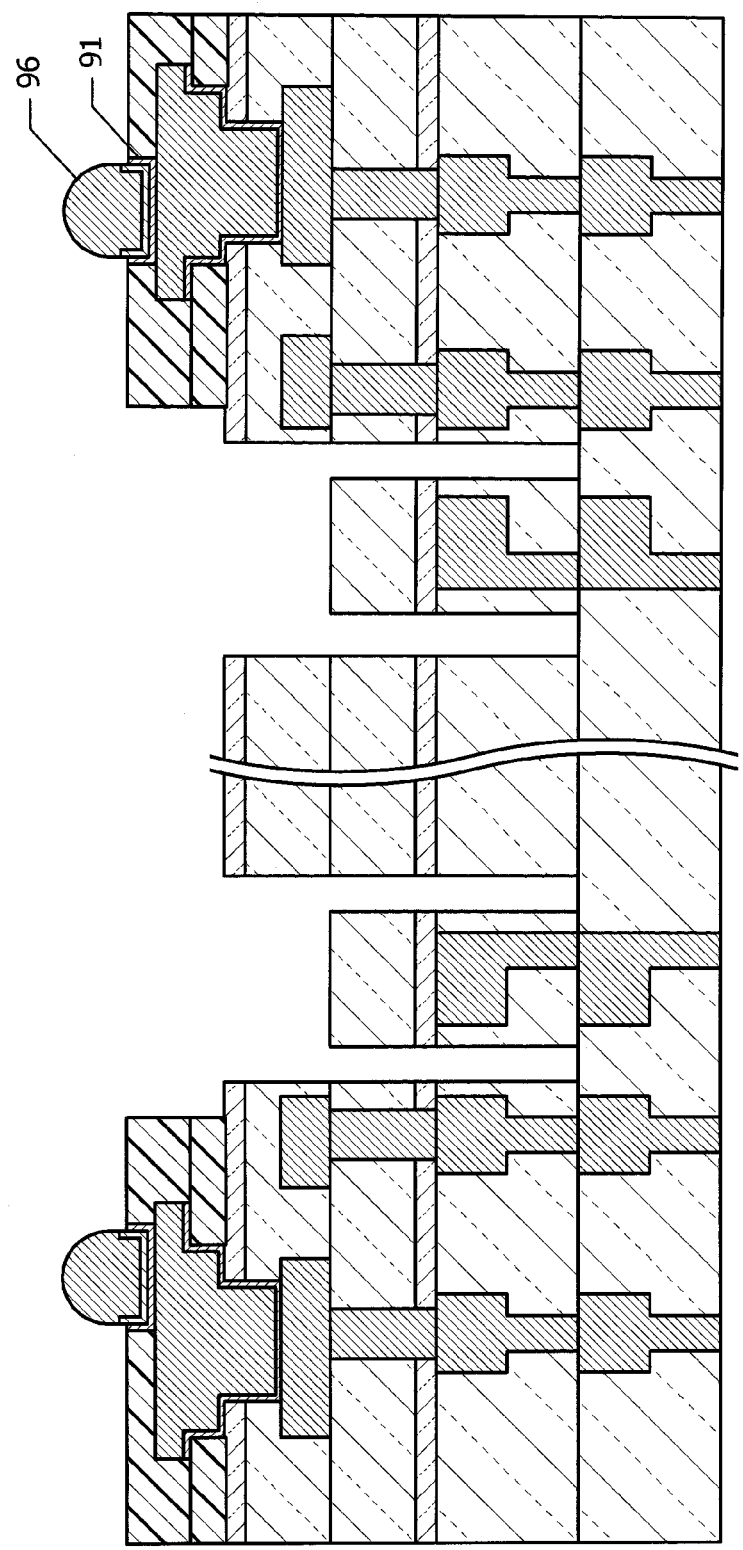

As illustrated in FIG. 13, the bumps (96) are subjected to a reflow treatment. Then, the exposed seed film (91) is removed by etching. After etching the seed film (91), an alkali chemical solution is used to perform a surface treatment. With this operation, the insulation among the plurality of bumps (96) can be secured.

Figure 14:
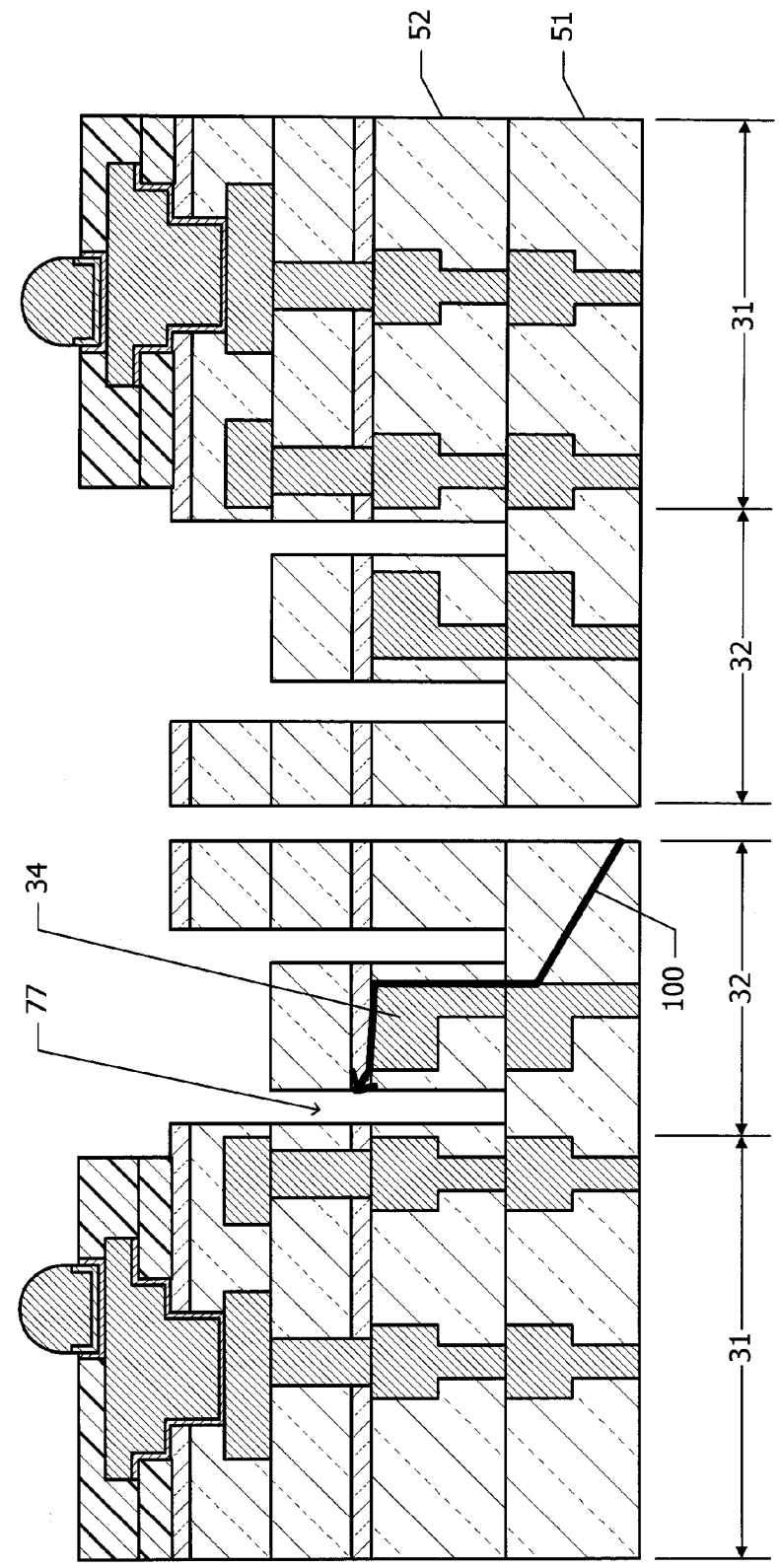

As illustrated in FIG. 14, the semiconductor wafer (30) is scribed at the center of each scribe region (32), to divide the respective product regions (31). If a crack (100) occurs during scribing, the crack (100) reaches the corresponding crack protection ring (34). Subsequently the crack (100) propagates along the interface between the crack protection ring (34) and the insulation films (51) and (52), etc. Finally, the crack (100) reaches the groove (77) formed more on the inner peripheral side than the crack protection ring (34), and is terminated at the groove (77). Accordingly, it can be prevented that the crack (100) propagates to the corresponding product region (31).

In reference to FIGS. 15 to 19, a semiconductor device production process as a comparative example is explained. In FIGS. 15 to 19, the respective components are given the same symbols as those of the corresponding components of the semiconductor device produced by the process of Example 1.

Figure 15:
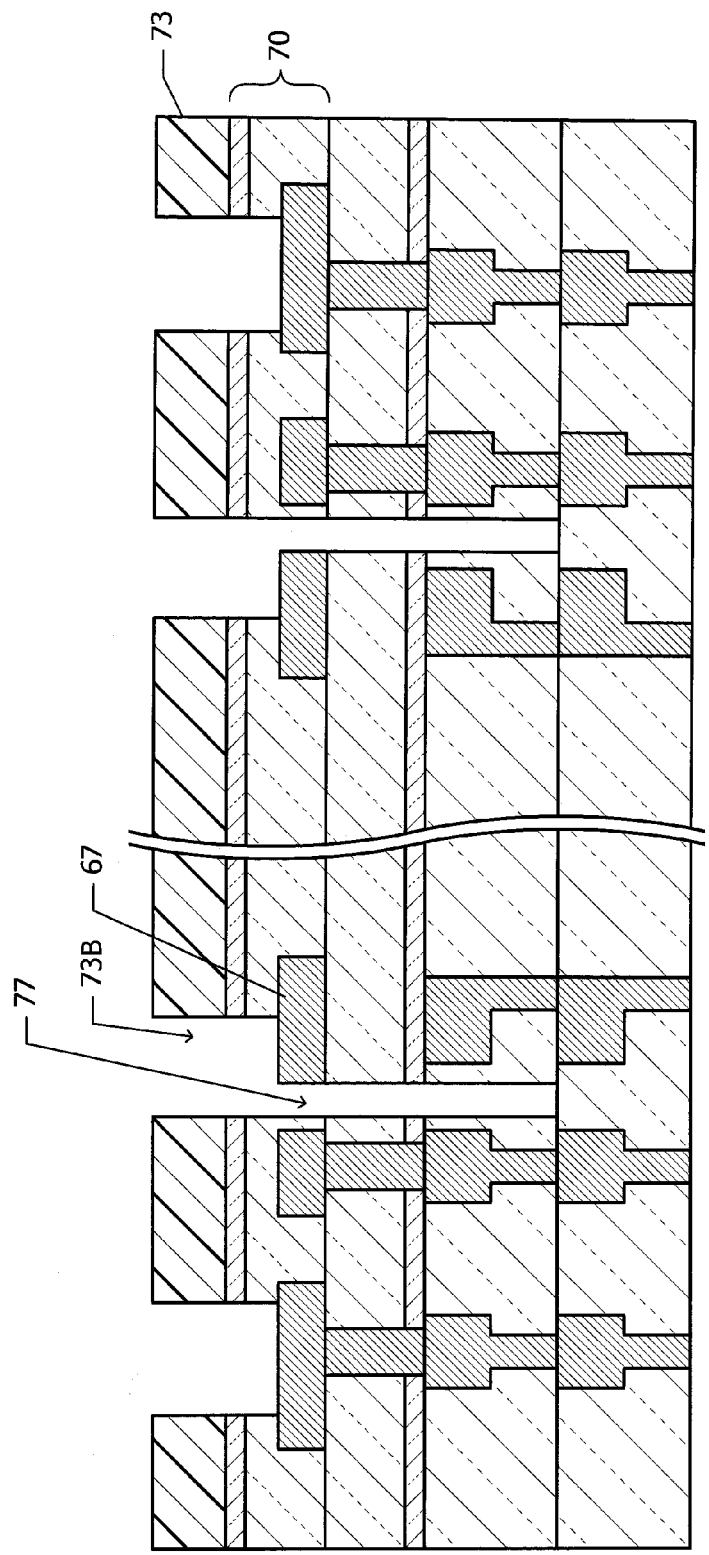
FIGS. 15 to 19 are sectional views illustrating the semiconductor device of a comparative example in a process of being produced.

The structure illustrated in FIG. 15 corresponds to the structure illustrated in FIG. 5 for the process of Example 1. In Example 1, the edge of each opening (73B) on the outer peripheral side formed in the resist film (73) is disposed more outside than the corresponding metal film (67). In the comparative example illustrated in FIG. 15, the edge of each opening (73B) on the outer peripheral side overlies the corresponding metal film (67) on a plan view. Consequently, each groove (77) is formed only on the inner peripheral side of the corresponding metal film (67), and no groove is formed on the outer peripheral side.

Figure 16:
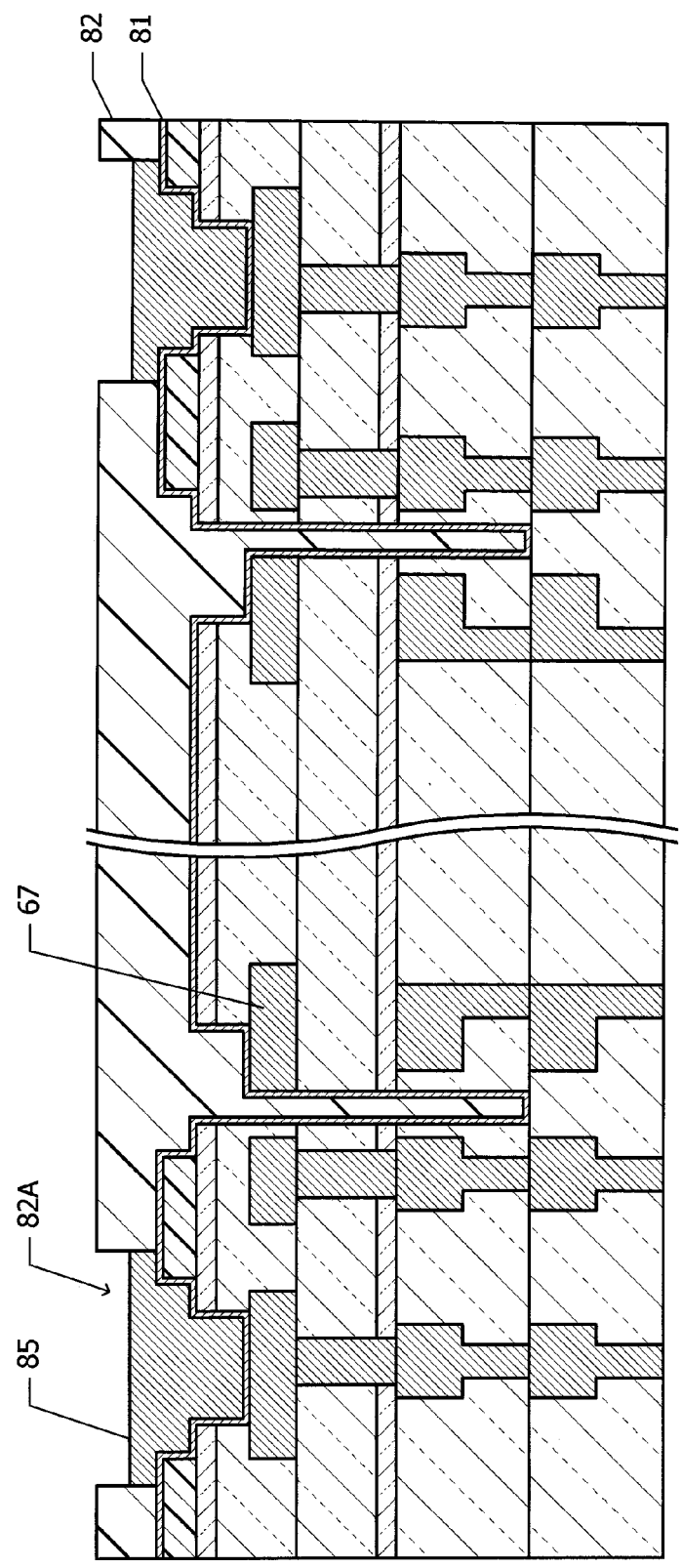

The structure illustrated in FIG. 16 corresponds to the structure illustrated in FIG. 8 for the process of Example 1. In the comparative example, no groove is formed on the outer peripheral side of each metal film (67). Except the groove, the structure is identical to the structure of FIG. 8 for the process of Example 1.

Figure 17:
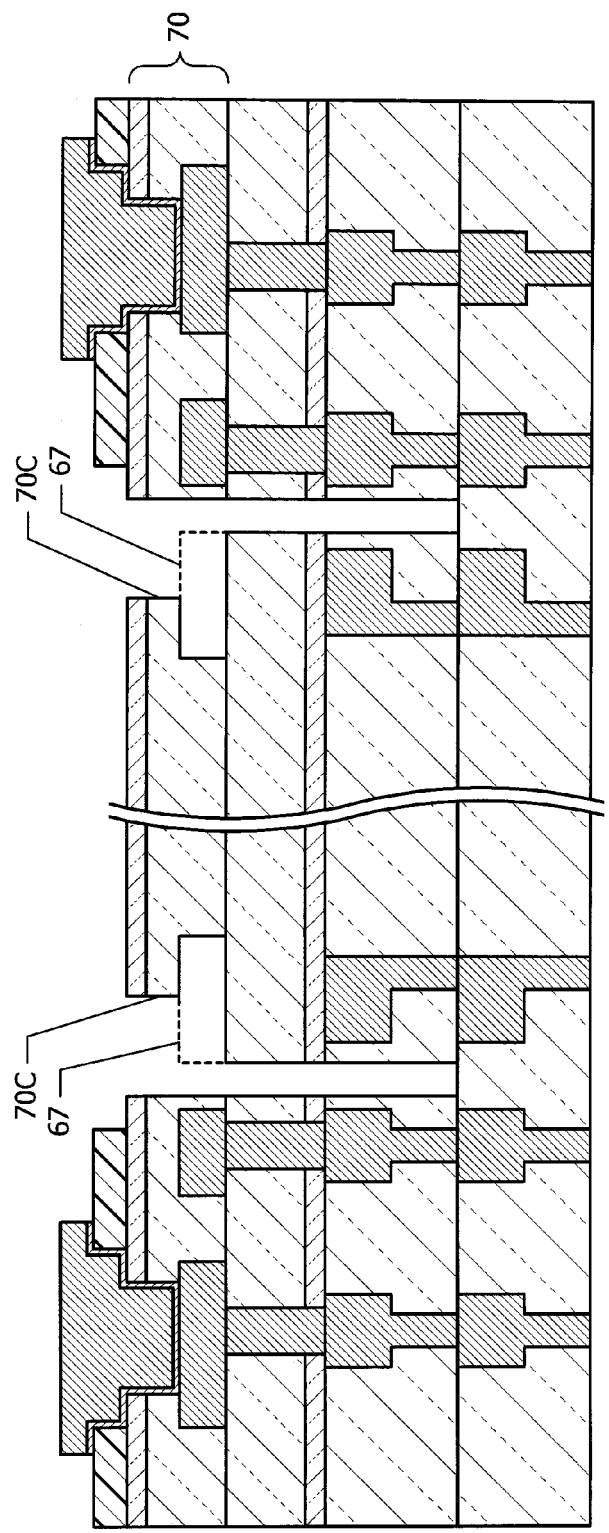

The structure illustrated in FIG. 17 corresponds to the structure illustrated in FIG. 9 for the process of Example 1. If the metal films (67) are removed, the portion (70C) disposed on each metal film (67), of the protection film (70) remains like an edge of a roof. Immediately below the portion (70C) remaining like an edge of a roof, a cavity is formed.

Figure 18:
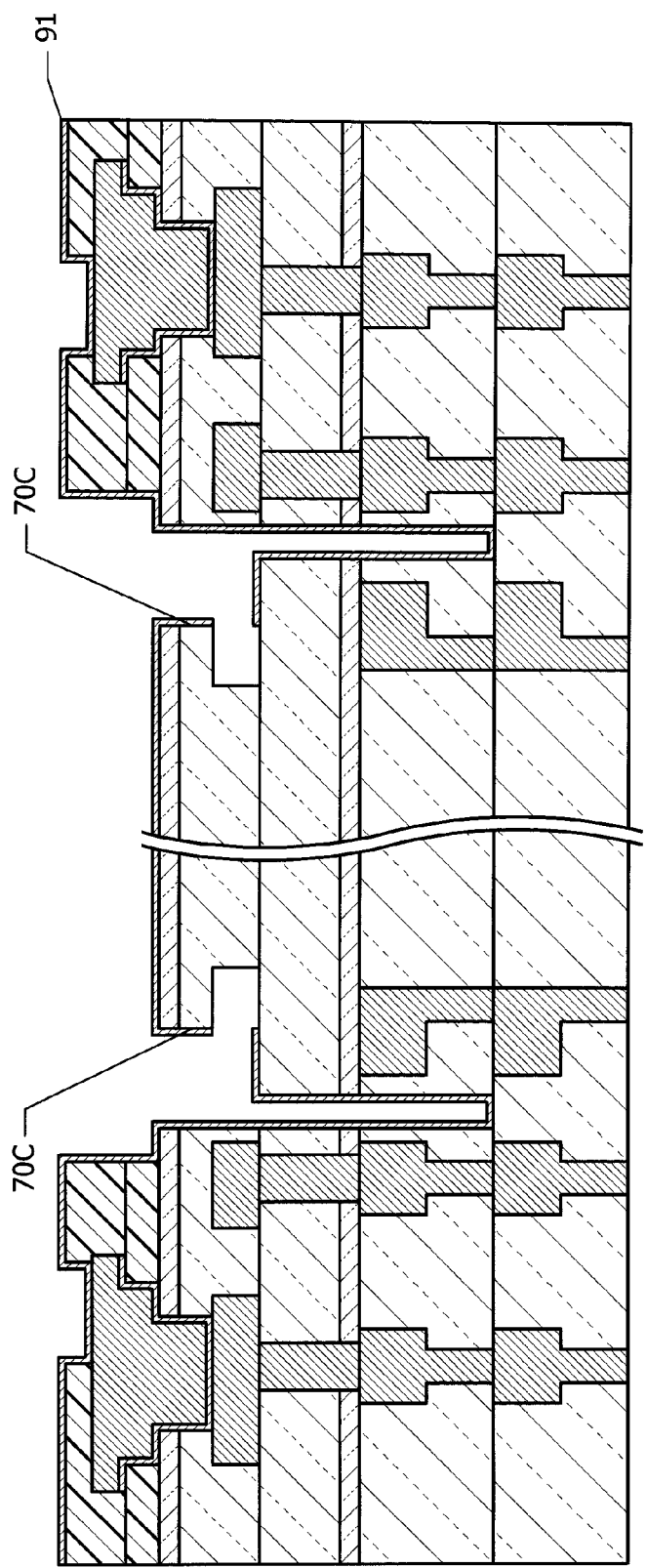

The structure illustrated in FIG. 18 corresponds to the structure illustrated in FIG. 10 for the process of Example 1. In Example 1, the seed film (91) covers the entire area of the surface continuously, but in the comparative example, the continuity of the seed film (91) is suspended at the tip portion of each portion (70C) remaining like an edge of a roof.

Figure 19:
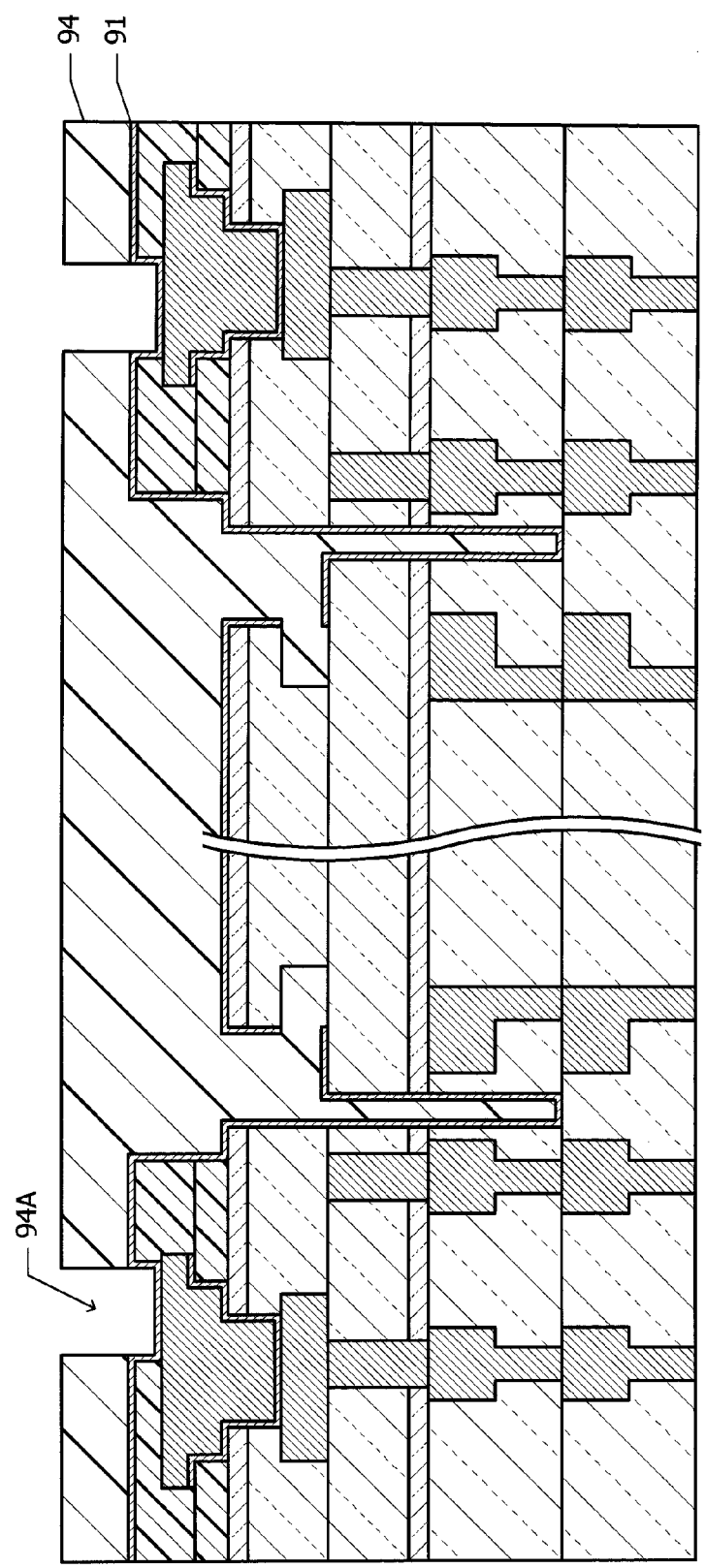

The structure illustrated in FIG. 19 corresponds to the structure illustrated in FIG. 11 for the process of Example 1. Since the seed film (91) is not continuous, the seed film (91) cannot be used as an electrode for electrolytic plating. Accordingly, on the seed film (91) in each opening (94A), the bump backing film (95) and the bump (96) cannot be formed by electrolytic plating.

On the contrary, in Example 1, as illustrated in FIG. 9, even if each metal film (67) is removed, the portion like an edge of a roof does not remain. Therefore, the seed film (91) can be formed continuously on the surface of the substrate. With this operation, electrolytic plating can be applied to the formation of the bump backing film (95) and the bump (96).

Next, in reference to FIG. 5, the relative positional relationship among the metal film (56), the metal film (54), the metal film (67) and the opening (73B) is explained. The metal film (56) is disposed as the uppermost layer among the plurality of metal films forming each crack protection ring (34), and the metal film (54) is disposed as the 2nd layer from the top.

The width of the metal film (67) is denoted by Wa, and the widths of the metal films (56) and (54) are denoted by Wc. The interval between the edge of the metal film (56) on the inner peripheral side and the edge of the metal film (67) on the inner peripheral side is denoted by Wi. The maximum values of shifts of the metal films (56) and (54) from the design positions are denoted by Dm.

In this case, it is preferred that the design value of the interval Wi complies with the following inequality.

$$Wi \geq ((0.25 \times Wc)^2 + Dm^2)^{1/2}$$

If the interval (Wi) is designed to comply with the inequality, it can be prevented that the metal films (56) and (54) formed of Cu are exposed when the groove (77) is formed. For example, if the width (Wa) is 3.2 μm and the width (Wc) is 2 μm, then it is preferred that the interval (Wi) is 0.6 μm or more. If the interval (Wi) is wide, the scribe region (32) becomes wide. Consequently it is not preferred that the interval (Wi) is wider than necessary. It is preferred that the interval (Wi) is 1.1 times or less of the right side of the formula.

The interval between the edge of the metal film (56) on the outer peripheral side and the edge of the metal film (67) on the outer peripheral side is denoted by Wo. It is preferred that the design value of the interval (Wo) complies with the following inequality like the interval (Wi).

$$Wo \geq ((0.25 \times Wc)^2 + Dm^2)^{1/2}$$

The widths of the grooves (77) and (78) depend on the relative positional accuracy between the metal film (67) and the opening (73B). If a positional shift occurs causing the edge of the opening (73B) on the inner peripheral side overlies the metal film (67), the groove (77) cannot be formed. Considering the relative positional accuracy between the metal film (67) and the opening (73B), it is preferred that the widths of the grooves (77) and (78) are 1 μm or more. If the widths of the grooves (77) and (78) are made wider, the width of the scribe region (32) becomes wide. In order to inhibit the excessive increase of the width of the scribe region, it is preferred that the widths of the grooves (77) and (78) are 3 μm or less.

Example 2

Figure 20:
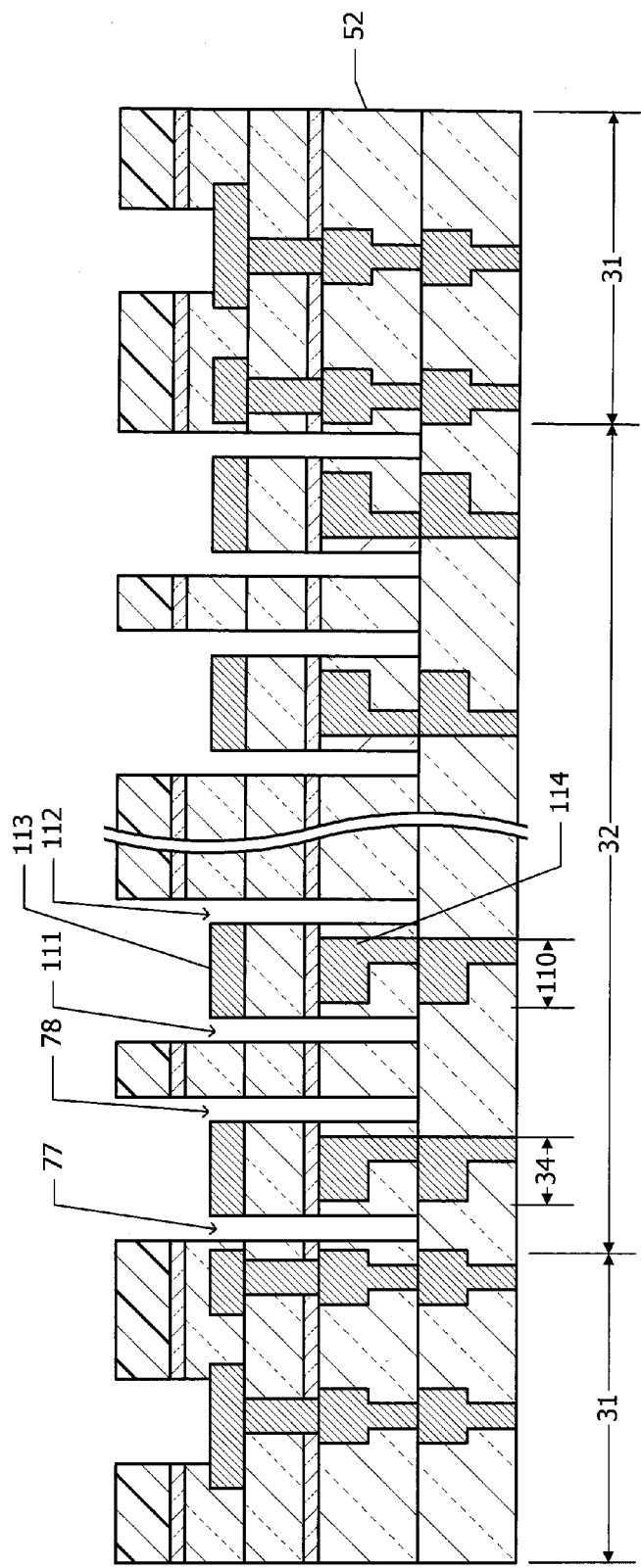
FIG. 20 is a sectional view illustrating the semiconductor device of Example 2 in a process of being produced.

FIG. 20 is a sectional view illustrating the semiconductor device of Example 2 in a process of being produced. The structure illustrated in FIG. 20 corresponds to the structure of the step illustrated in FIG. 5 of Example 1. In Example 1, one crack protection ring (34) is formed for each product region (31). In Example 2, outside the crack protection ring (34), a 2nd crack protection ring (110) is formed to surround the crack protection ring (34) on a plan view. The laminate structure of the crack protection ring (110) is the same as the laminate structure of the crack protection ring (34) of the inner peripheral side. That is, the crack protection ring (110) contains a metal film (114) in the wiring layer (52). Above the metal film (114), a metal film (113) acting as an etching mask is disposed.

On the inner peripheral side and on the outer peripheral side of the crack protection ring (110), grooves (111) and (112) are formed respectively. The grooves (111) and (112) are formed in the same step as that for forming the grooves (77) and (78) disposed on both sides of the crack protection ring (34) of the inner peripheral side.

If the crack protection ring (110) is formed further outside the crack protection ring (34), the performance for protecting from the propagation of cracks can be enhanced.

Figure 21:
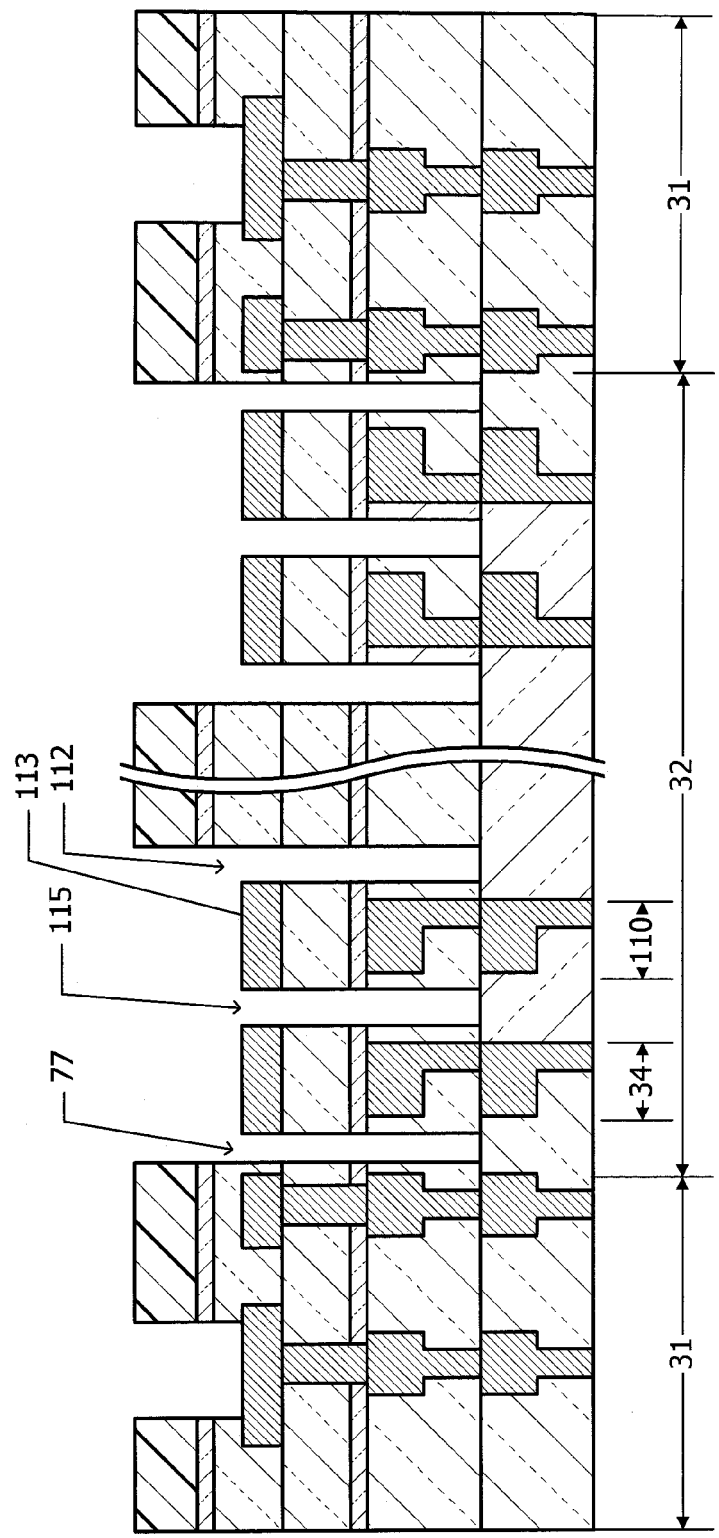
FIG. 21 is a sectional view illustrating the semiconductor device of Modified Example 1 of Example 2 in a process of being produced.

FIG. 21 is a sectional view illustrating the semiconductor device of Modified Example 1 of Example 2 in a process of being produced. In Modified Example 1, the grooves (78) and (111) illustrated in FIG. 20 are integrated to form one groove (115). If the grooves (78) and (111) are made to contact each other to form one groove (115), the width of the scribe region (32) can be narrowed.

Figure 22:
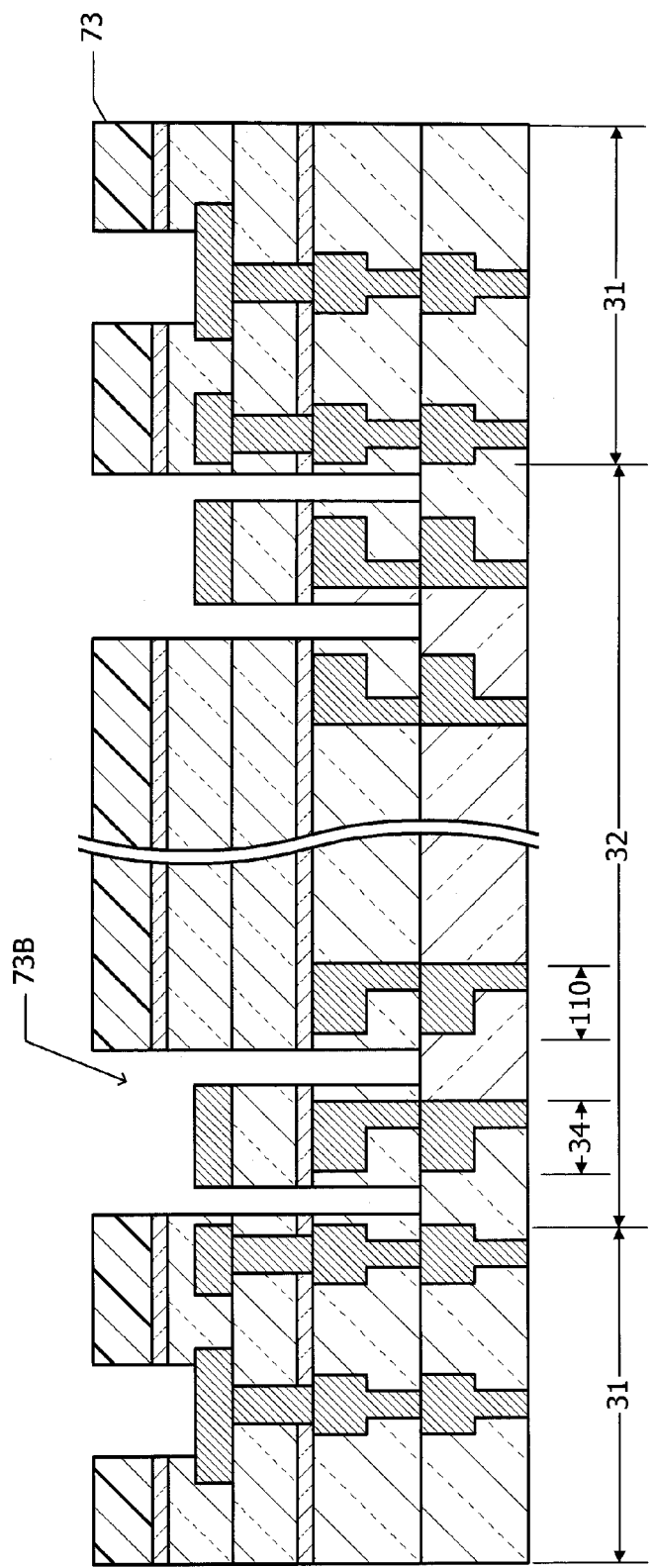
FIG. 22 is a sectional view illustrating the semiconductor device of Modified Example 2 of Example 2 in a process of being produced.

FIG. 22 is a sectional view illustrating the semiconductor device of Modified Example 2 of Example 2 in a process of being produced. In Modified Example 2, the groove (112) of the outermost side illustrated in FIG. 21 is not formed. In Modified Example 1, when the grooves (77), (112) and (115) are formed, the region where the outside crack protection ring (110) is disposed is protected by the metal film (113). In Modified Example 2, the metal film (113) is not disposed, and the region where the outside crack protection ring (110) is disposed is protected by a resist film (73). Since the positioning margin for forming the groove (112) is not required to be secured, the scribe region (32) can be more narrowed.

Figure 23:
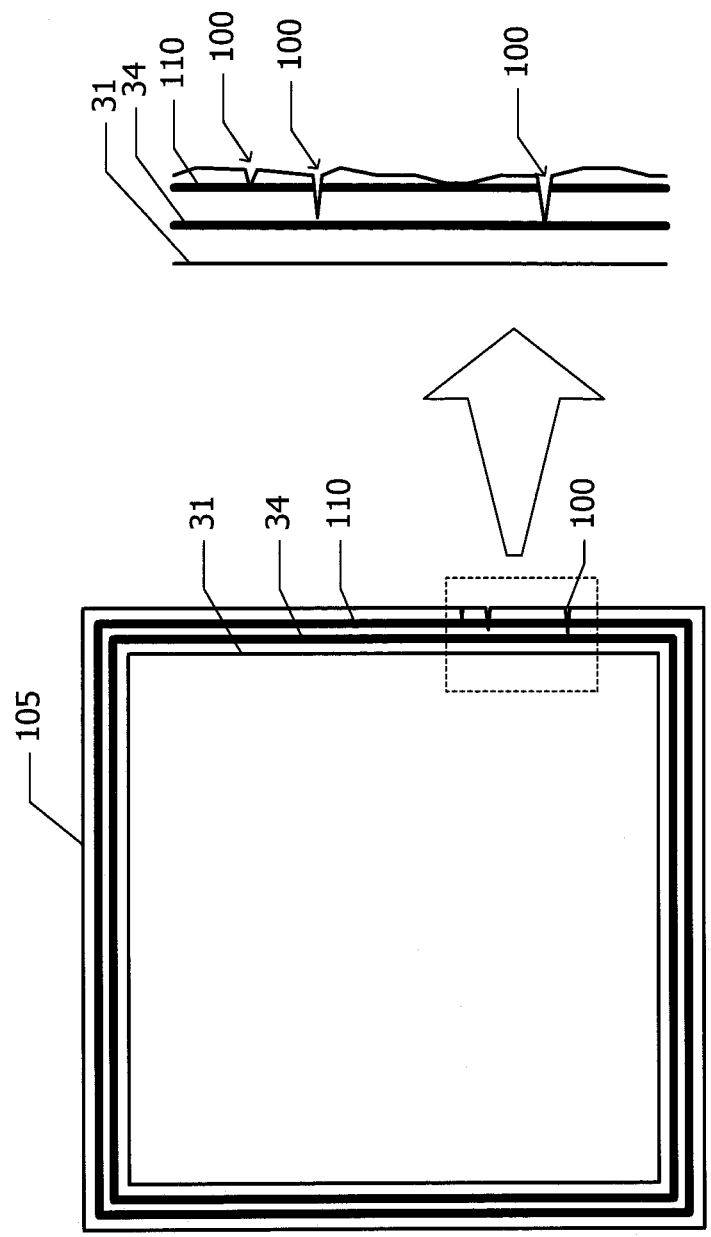
FIG. 23 is a plan view illustrating the semiconductor device of Example 2.

FIG. 23 is a plan view illustrating a scribed semiconductor device produced by the process of Example 2. Outside the product region (31), the crack protection ring (34) of the inner peripheral side is disposed, and outside the crack protection ring (34), the crack protection ring (110) of the outer peripheral side is disposed. From an edge of the semiconductor device (105) obtained by dividing each product region (31), cracks (100) extend toward the inside.

Some cracks (100) cross the crack protection ring (110) of the outer peripheral side and reach the crack protection ring (34) of the inner peripheral side. The crack protection ring (34) of the inner peripheral side prevents the cracks (100) from reaching the product region (31). In this case, the crack protection ring (110) of the outer peripheral side is divided in the peripheral direction by the cracks (100).

As described above, after scribing, the crack protection rings (34) and (110) do not always continuously surround the periphery of the product region (31). Even in the case where the crack protection rings (34) and (110) are divided by cracks (100), the propagation of the cracks (100) into the product region (31) can be prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A process for producing a semiconductor device comprising:
   forming a 1st insulation film above a substrate in which a product region and scribe regions surrounding the product region are defined;
   forming a 1st metal film in the 1st insulation layer within the scribe regions in such a manner as to surround the product region;
   forming a 2nd insulation film on the 1st metal film and the 1st insulation film;
   forming a 2nd metal film on the 2nd insulation film, wherein the 2nd metal film is disposed within the scribe regions in such a manner to surround the product region, an edge of the 2nd metal film on an inner peripheral side is positioned more inside than the 1st metal film, and an edge of the 2nd metal film on an outer peripheral side is positioned more outside than the 1st metal film;
   forming an insulating protection film on the 2nd metal film and the 1st insulation film;
   forming a mask pattern including a 1st opening portion on the protection film, wherein the 1st opening portion is disposed within the scribe regions in such a manner as to surround the product region, an edge of the 1st opening portion on an inner peripheral side is positioned more inside than the 2nd metal film, and an edge of the 1st opening portion on an outer peripheral side is positioned more outside than the 2nd metal film; and
   etching the protection film by using the mask pattern as mask, to expose the 2nd metal film, and subsequently etching the 2nd insulation film and the 1st insulation film to positions deeper than a top surface of the 1st metal film, by using the 2nd metal film as mask, to thereby form grooves on both sides of the 2nd metal film.

2. The process for producing a semiconductor device according to claim 1, wherein:
   in the forming a 2nd metal film, a pads is formed simultaneously with the 2nd metal film within the product region;
   in the etching to form the grooves, a pad opening portion to expose the pad is formed in the protection film; and
   after the grooves are formed, the process further comprises:
   removing the mask pattern;
   forming a first seed film on a surface exposed after removing the mask pattern;
   forming a 1st resist film with a plating opening portion formed to overlie the pad opening portion, on the 1st seed film;
   depositing a conductive member by plating on the first seed film within the plating opening portion;
   removing the 1st resist film after depositing the conductive member;
   removing the 1st seed film of a region covered with the 1st resist film and removing the 2nd metal film, after removing the 1st resist film;
   forming a 2nd seed film on a surface exposed after removing the 1st seed film and the 2nd metal film;
   forming a 2nd resist film with a bump opening portion formed to overlie the conductive member, on the 2nd seed film;
   forming a bump on the 2nd seed film within the bump opening portion by electrolytic plating;
   removing the 2nd resist film after forming the bump; and
   removing the 2nd seed film of a region covered with the 2nd resist film after removing the 2nd resist film.

3. The process for producing a semiconductor device according to claim 2, further comprising scribing the substrate within the scribe regions after removing the second seed film.

4. A producing method of a semiconductor device comprising:
   forming a 1st insulation film above a substrate that includes a product region and a scribe region surrounding the product region;
   forming a 1st metal film in the 1st insulation film, wherein the 1st metal film is located in the scribe region of the substrate and surrounds the product region of the substrate on a plan view;

forming a 2nd insulation film on the 1st metal film and the 1st insulation film;

forming a 2nd metal film on the 2nd insulation film, wherein the 2nd metal film is located in the scribe region of the substrate and surrounds the product region of the substrate on a plan view, an inner edge of the 2nd metal film is positioned nearer to the product region of the substrate than an inner edge of the 1st metal film, and an outer edge of the 2nd metal film is positioned further from the product region of the substrate than an outer edge of the 1st metal film;

forming an insulating protection film on the 2nd metal film and the 2nd insulation film; and forming a 1st groove and a 2nd groove by etching the protection film, the 2nd insulation film and at least part of the 1st insulation film, wherein the 1st groove and the 2nd groove include bottoms that are lower than a top surface of the 1st metal film respectively, the first groove surrounds the product region of the substrate and is surrounded by the 1st metal film on a plan view, and the 2nd groove surrounds the 1st metal film on a plan view.

5. The producing method of a semiconductor device according to claim 4, wherein:

in forming the 2nd metal film, a pad is formed in the product region of the substrate and on the 2nd insulation film; and in forming the 1st groove and the 2nd groove, a pad opening portion, that exposes the pad, is formed in the protection film by etching the protection film.

6. The producing method of a semiconductor device according to claim 5, further comprising scribing the substrate within the scribe regions after forming the 1st groove and the 2nd groove.

7. The producing method of a semiconductor device according to claim 4, further comprising:

before forming the 1st groove and the 2nd groove, forming a mask pattern that above the 1st metal film in the scribe region, wherein:

the mask pattern includes a 1st opening portion;

the 1st opening includes an inner peripheral side that is surrounded by the 1st metal film and that surrounds the product region in a plan view;

the 1st opening includes an outer peripheral side that surrounds the 1st metal film in a plan view;

in forming the 1st groove and the 2nd groove, the protection film and the 2nd insulation film is removed by using the mask pattern as a mask.

8. The producing method of a semiconductor device according to claim 5, further comprising:

forming a 1st seed film on a surface of the pad after forming the pad opening portion;

forming a conductive member on the 1st seed film;

forming a 2nd seed film on a surface of the conductive member; and forming a bump on the 2nd seed film.

9. The producing method of a semiconductor device according to claim 4, further comprising:

removing the 2nd metal film after forming the 1st groove and the 2nd groove.

10. The producing method of a semiconductor device according to claim 4, wherein:

in forming the 1st metal film, a 3rd metal film is formed in the 1st insulation film of the scribe region; and the 3rd metal film surrounds the 1st metal film.

11. The producing method of a semiconductor device according to claim 4, wherein:

in forming the 2nd metal film, a 4th metal film is formed in the 2nd insulation film of the scribe region.

12. The producing method of a semiconductor device according to claim 4, wherein:

in forming the 1st groove and the 2nd groove, a 3rd groove is formed in the protective film and the 2nd insulation film;

the 3rd groove surrounds the 3rd metal film; and a bottom of the 3rd groove is located lower than a top surface of the 3rd metal film.

13. The producing method of a semiconductor device according to claim 6, wherein:

in forming the 1st groove and the 2nd groove, a 4th groove is formed in the protective film and the 2nd insulation film;

the 4th groove is surrounded by the 3rd metal film and surrounds the 2nd groove; and a bottom of the 4th groove is located lower than a top surface of the 3rd metal film.

* * * * *